United States Patent
de Abreu Pinho et al.

(10) Patent No.: US 11,641,212 B2
(45) Date of Patent: May 2, 2023

(54) PROBABILISTIC MODEL FOR FILE-SPECIFIC COMPRESSION SELECTION UNDER SLA-CONSTRAINTS

(71) Applicant: EMC IP Holding Company LLC, Hopkinton, MA (US)

(72) Inventors: Rômulo Teixeira de Abreu Pinho, Niteroi (BR); Vinicius Michel Gottin, Rio de Janeiro (BR); Joel Christner, San Jose, CA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 109 days.

(21) Appl. No.: 17/199,914

(22) Filed: Mar. 12, 2021

(65) Prior Publication Data
US 2022/0294470 A1 Sep. 15, 2022

(51) Int. Cl.
| | |
|---|---|
| *H03M 7/00* | (2006.01) |
| *H03M 7/30* | (2006.01) |
| *G06F 16/17* | (2019.01) |
| *G06N 7/00* | (2023.01) |
| *H03M 7/40* | (2006.01) |
| *G06F 3/06* | (2006.01) |

(52) U.S. Cl.
CPC .......... *H03M 7/6082* (2013.01); *G06F 16/17* (2019.01); *G06N 7/005* (2013.01); *H03M 7/3062* (2013.01); *G06F 3/06* (2013.01); *H03M 7/40* (2013.01)

(58) Field of Classification Search
CPC .... H03M 7/6082; H03M 7/3062; H03M 7/40; G06F 16/17; G06F 3/06; G06F 17/30153; G06N 7/005
See application file for complete search history.

(56) References Cited

U.S. PATENT DOCUMENTS

| | | |
|---|---|---|
| 9,450,603 B2 | 9/2016 | Dickie |
| 9,503,123 B1 | 11/2016 | Pinho et al. |
| 9,558,566 B2 | 1/2017 | Charikar et al. |
| 9,660,666 B1 | 5/2017 | Ciarlini et al. |
| 9,898,375 B1 | 2/2018 | Fricker |
| 9,935,652 B1 | 4/2018 | Chalmer et al. |
| 9,954,550 B1 | 4/2018 | Ciarlini et al. |
| 9,973,210 B1 | 5/2018 | Mahony et al. |
| 10,044,370 B1 | 8/2018 | Pasha. B. K. |
| 10,103,745 B1 | 10/2018 | Rodrigues et al. |
| 10,122,379 B1 | 11/2018 | Ciarlini et al. |
| 10,133,551 B1 | 11/2018 | Ciarlini et al. |
| 10,153,779 B1 | 12/2018 | Bordignon et al. |

(Continued)

OTHER PUBLICATIONS

Kooten, P. van. (2019). shrynk—Using Machine Learning to learn how to Compress. Retrieved Dec. 11, 2019, from https://vks.ai/2019-12-05-shrynk-using-machine-learning-to-learn-how-to-compress.

(Continued)

*Primary Examiner* — Joseph J Lauture

(74) *Attorney, Agent, or Firm* — Workman Nydegger

(57) ABSTRACT

One example method includes file specific compression selection. Compression metrics are generated for a chunk of a file. Using a set of training data, the compression metrics are corrected using a correction factor to determine estimated file compression metrics. A compressor is then selected to compress the file based on at least the estimated file compression metrics.

20 Claims, 22 Drawing Sheets

(56) References Cited

U.S. PATENT DOCUMENTS

| | | |
|---|---|---|
| 10,169,359 B1 | 1/2019 | Pinho et al. |
| 10,200,060 B1 | 2/2019 | Ciarlini et al. |
| 10,235,134 B1 | 3/2019 | Dangi et al. |
| 10,452,616 B1 | 10/2019 | Bassov |
| 10,505,563 B1 | 12/2019 | Gonczi |
| 10,509,676 B1 | 12/2019 | Bassov |
| 10,585,856 B1 | 3/2020 | Bigman |
| 10,666,289 B1 | 5/2020 | Sofia et al. |
| 10,749,546 B1 | 8/2020 | Sun |
| 10,762,667 B2 | 9/2020 | Mekuria |
| 11,068,405 B2 | 7/2021 | Armangau et al. |
| 2005/0265585 A1 | 12/2005 | Rowe |
| 2005/0265586 A1 | 12/2005 | Rowe et al. |
| 2005/0271258 A1 | 12/2005 | Rowe |
| 2011/0163163 A1 | 7/2011 | Rowe |
| 2014/0379866 A1 | 12/2014 | Perlman et al. |
| 2015/0205992 A1 | 7/2015 | Rowe |
| 2016/0014437 A1 | 1/2016 | Perlman et al. |
| 2017/0235497 A1 | 8/2017 | Shih |
| 2018/0067679 A1 | 3/2018 | Heddes et al. |
| 2018/0234110 A1 | 8/2018 | Kaldewey |
| 2020/0134048 A1* | 4/2020 | Faibish .............. G06F 16/1748 |
| 2020/0341668 A1 | 10/2020 | Gonczi |
| 2020/0341670 A1 | 10/2020 | Zhang et al. |
| 2020/0348957 A1 | 11/2020 | Krasner et al. |
| 2020/0348959 A1 | 11/2020 | Krasner et al. |
| 2021/0027115 A1 | 1/2021 | Davis et al. |
| 2021/0281491 A1 | 9/2021 | Yelahanka et al. |
| 2022/0129190 A1 | 4/2022 | Bassov |

OTHER PUBLICATIONS

Murashko, O. (2018). *Using Machine Learning To Select and Optimise Multiple Objectives in Media Compression*. PhD Thesis. University of St Andrews. Retrieved from http://research-repository.st-andrews.ac.uk/.

Sneyers, J., & Wuille, P. (2016). *FLIF: Free lossless image format based on MANIAC compression*. In 2016 IEEE International Conference on Image Processing (ICIP) (pp. 66-70). IEEE.

Apache Pulsar, https://streamnative.io/en/blog/tech/2021-01-14-pulsar-architecture-performance-tuning/ (accessed Jun. 2022).

Harwath, D., & Glass, J. (2015). Deep Multimodal Semantic Embeddings for Speech and Images. 237-244, 8 pages.

IBM-MQ, https://www.ibm.com/docs/en/ibm-mq/9.1?topic=applications-channel-compression-in-mq-classes-java (accessed, Jun. 2022).

J.-I. Gailly and M. Adler, "Gzip," 2003, 1 page.

Kafka, https://www.conduktor.io/kafka/kafka-message-compression (accessed Jun. 2022).

Lin, T. Y., Maire, M., Belongie, S., Hays, J., Perona, P., Ramanan, D., Dollár, P., & Zitnick, C. L. (2014). Microsoft COCO: Common objects in context. Lecture Notes in Computer Science (Including Subseries Lecture Notes in Artificial Intelligence and Lecture Notes in Bioinformatics), 8693 LNCS(PART 5), 740-755. 16. pages.

M. Isenburg and P. Alliez, "Compressing polygon mesh geometry with parallelogram prediction," in IEEE Visualization, 2002. VIS 2002., Nov. 2002, pp. 141-146, 6 pages.

M. Mahoney, "Paq8," 2007, 9 pages.

P. Lindstrom and M. Isenburg, "Fast and efficient compression of floating-point data." IEEE transactions on visualization and computer graphics, vol. 12, No. 5, pp. 1245-1250, 2006, 7 pages.

Palov, "7-zip is a file archiver with a high compression ratio," 2016, 2 pages.

Pinho et al; U.S. Appl. No. 17/305,112, filed Jun. 30, 2021.

RabbitMQ, https://www.rabbitmq.com/clustering-compression.html (accessed Jun. 2022).

Y. Collet, "Lz4," 2017, 12 pages.

Z. Tarantov, "Snappy," 2011, 2 pages.

\* cited by examiner

| File | size | chunk | compressor | ratio | compression throughput | decompression throughput |
|---|---|---|---|---|---|---|
| File1.bmp | 25 MB | 25 % | LosslessJPEG | 2:1 | 40 MB/s | 50 MB/s |
| File1.bmp | 25 MB | 25 % | Gzip | 1.3:1 | 50 MB/s | 70 MB/s |
| File1.bmp | 25 MB | 25 % | Lzma | 1.5:1 | 45 MB/s | 60 MB/s |
| File1.bmp | 25 MB | 25 % | FLIF | 2.2:1 | 20 MB/s | 20 MB/s |
| File1.bmp | 50 MB | 50 % | LosslessJPEG | 1.8:1 | 48 MB/s | 65 MB/s |
| File1.bmp | 50 MB | 50 % | Gzip | 1.2:1 | 60 MB/s | 80 MB/s |
| ... | ... | ... | ... | ... | ... | ... |

PROBABILISTIC MODEL FOR FILE-SPECIFIC COMPRESSION SELECTION UNDER SLA-CONSTRAINTS

FIELD OF THE INVENTION

Embodiments of the present invention generally relate to data processing operations. More particularly, at least some embodiments of the invention relate to systems, hardware, software, computer-readable media, and methods for data compression operations.

BACKGROUND

Data management is related to a variety of different operations. Backup operations, archive operations, and deduplication operations are examples of data management operations. Another aspect of data management relates to data compression, including lossless data compression. Backup operations, archive operations, and data transmission operations, for example, benefit from compression.

For example, by compressing data, storage and bandwidth usage is improved. More data can be stored in less storage space and more data can be transmitted using less bandwidth when data is compressed.

Data compression operations, however, also consume processing and other computing resources and there is often a need to balance service level agreement (SLA) requirements with compression levels. Stated differently, lossless compression engines may be subject to SLA constraints.

Conventionally, compression operations are performed using predetermined algorithms. However, this may not be ideal at least because the best compression algorithm for one object may not be the best compression algorithm for a different object, even when the objects are of the same type.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings, in which.

DETAILED DESCRIPTION OF SOME EXAMPLE EMBODIMENTS

Figure 1:
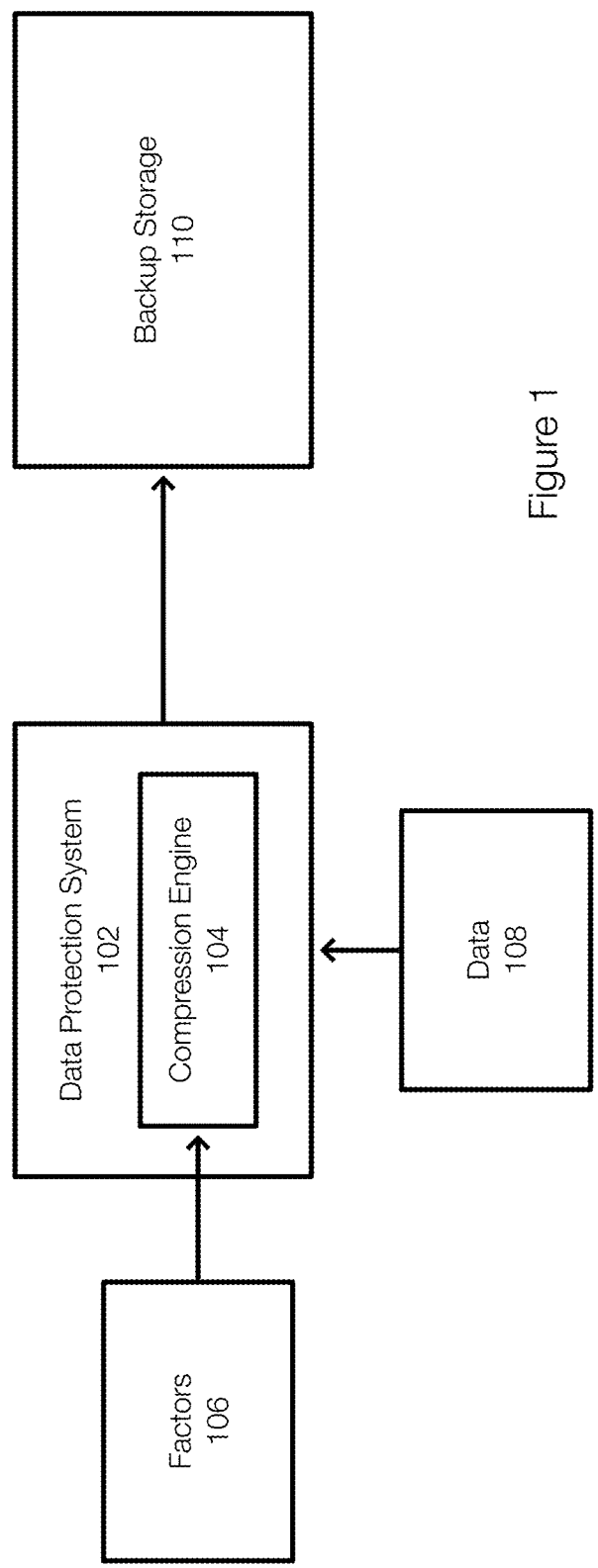
FIG. 1 discloses aspects of a data protection engine that includes a compression engine configured to select a compressor for a file.

Embodiments of the present invention generally relate to data protection and data management. More particularly, at least some embodiments of the invention relate to systems, hardware, software, computer-readable media, and methods for data management or protection operations such as backup operations, restore operations, archive operations, and data transmission operations.

More specifically, example embodiments of the invention relate to compression operations. Embodiments of the compression operations disclosed herein may be performed in isolation or in the context or a larger operation such as a backup operation or a data transmission operation. The compression operations may include or relate to machine learning models, compression algorithm selection, and data compression.

Lossless data compression is an integral aspect of data management. Compressing data in a lossless manner to less than its original size potentially enables, compared to the original uncompressed data, increased transmission speeds and reduced storage requirements. Embodiments of the invention further relate to compressors that are, in effect, aware of and that determine, prior to compression, the data type and of data patterns inside the data being compressed.

Embodiments of the invention achieve more efficient compression ratios by selecting better compression algorithms for a compression operation compared to simply applying a predetermined compression algorithm. More specifically, embodiments of the invention may select a compressor (e.g., a compression algorithm) based on characteristics of the data set, the intended application or context, and/or SLA constraints. Embodiments of the invention may select a compressor on a file-by-file basis while satisfying any relevant SLA constraints. This allows the selection of a compressor to account for the characteristics of the file being compressed. Thus, a compression operation performed on multiple files may use multiple compressors.

Embodiments of the invention consider the context of the compression operation. In data movement or transmission situations, a complex compression algorithm may be overkill for a simple image. More specifically, any improvement in the compression ratio may not compensate for the additional computation time, which ultimately adds to the overall data transmission time.

In another example where data is being archived, a complex (but slow) compression algorithm that achieves a high compression ratio may be the best option because of the reduction in storage requirements. Thus, embodiments of the invention, when selecting a compressor, may consider the context in addition to the compression ratio achieved by the compressor.

Generally, the effectiveness of a compressor often depends on or is related to the characteristics of the data set. Although there are generic compressors, better compression may be achieved using compressors that are tailored for specific data domains, types, or patterns. However, the fact that a compressor is tailored for a specific domain, type, or pattern does not mean that the domain or type specific features of the files are available and can be readily used. In fact, inspecting the features and preparing the engineering tasks to compose these features are complex and can impose a computation cost on the compression operation.

Embodiments of the invention, in contrast, allow content-aware compression optimization without the need for feature engineering. For example, a compressor may be selected based on file type, which may be determined based on the average performance of a compressor on a large training set of files.

Embodiments of the invention further expand on content awareness to account for data pattern variations that may occur within files of different types and of the same types. Advantageously, embodiments of the invention may select a compressor on a file-by-file basis.

Embodiments of the invention are further timely and do not substantially add to the time required to perform the compression operation or other operations. For example, selecting a compressor using averages may be efficient while capturing data patterns and estimating compression performance can be more costly in different ways. In contrast, selecting a compressor on a file-by-file basis, in accordance with embodiments of the invention, is more efficient that simply running all available compressors on a file to measure each compressor's performance and then selecting the best compressor.

Generally, embodiments of the invention evaluate the compression metrics on a portion or a chunk of the file being compressed. Using training data, this allows the compression metrics associated with compressing the chunk to estimate the compression metrics on the whole file. In other words, the training data allows a correction factor to be determined that can be applied to the compression metrics associated with the chunk. This results in estimated file compression metrics. The estimated file compression metrics are then used to select a compressor to compress the whole file. The computational cost is thus reduced because the best compressor can be selected based on the compression metrics of a small chunk of the file.

FIG. 1 discloses aspects of a data protection system that may perform data protection operations including compression and compression related operations. Embodiments of the invention, however, are not limited to data protection operations and can be implemented in any environment or system in which compression and compression related operations are performed.

FIG. 1 illustrates a data protection system 102 that includes a compression engine 104. The data 108 is an example of backup data and may be, for example, a copy of production data generated at a production system. For example, data in a production system may be replicated, backed up, or otherwise protected by the data protection system 102. The data protection system 102 may be a physical appliance, a virtual appliance, a cluster, local and/or cloud-based.

The compression engine 104 may select a specific compressor for the data 108 based on various factors 106. Because the data 108 may contain distinct files, objects, or the like, the compression engine 104 may select a compressor on a file-by-file basis, an object-by-object basis, or the like. Examples of the factors may include, but are not limited to, one or more of: file type, context, application, SLA constraints, or combination thereof or the like. The compressed data 108 may be stored in a backup storage 110, which may be local to the data protection system 102, remote from the data protection system 102, cloud-based, or the like or combination thereof.

The following discussion refers to the data 108 as files, but embodiments of the invention are not limited to files. Thus, embodiments of the invention may be performed on chunks, objects, blocks, or the like.

The compression engine 104 may estimate compression metrics for a file based on a portion or a chunk of the file. Generating compression metrics for a chunk can be performed more efficiently than generating compression metrics for the whole file, at least because less data is being processed. The chunk is typically configured to be a representation of the whole file and is, in effect, a smaller file. In other words, the chunk is extracted such that it conforms to the file format. This allows the compression engine 104 to select a compressor in a timely manner based on compressing a smaller "file".

Figure 2:
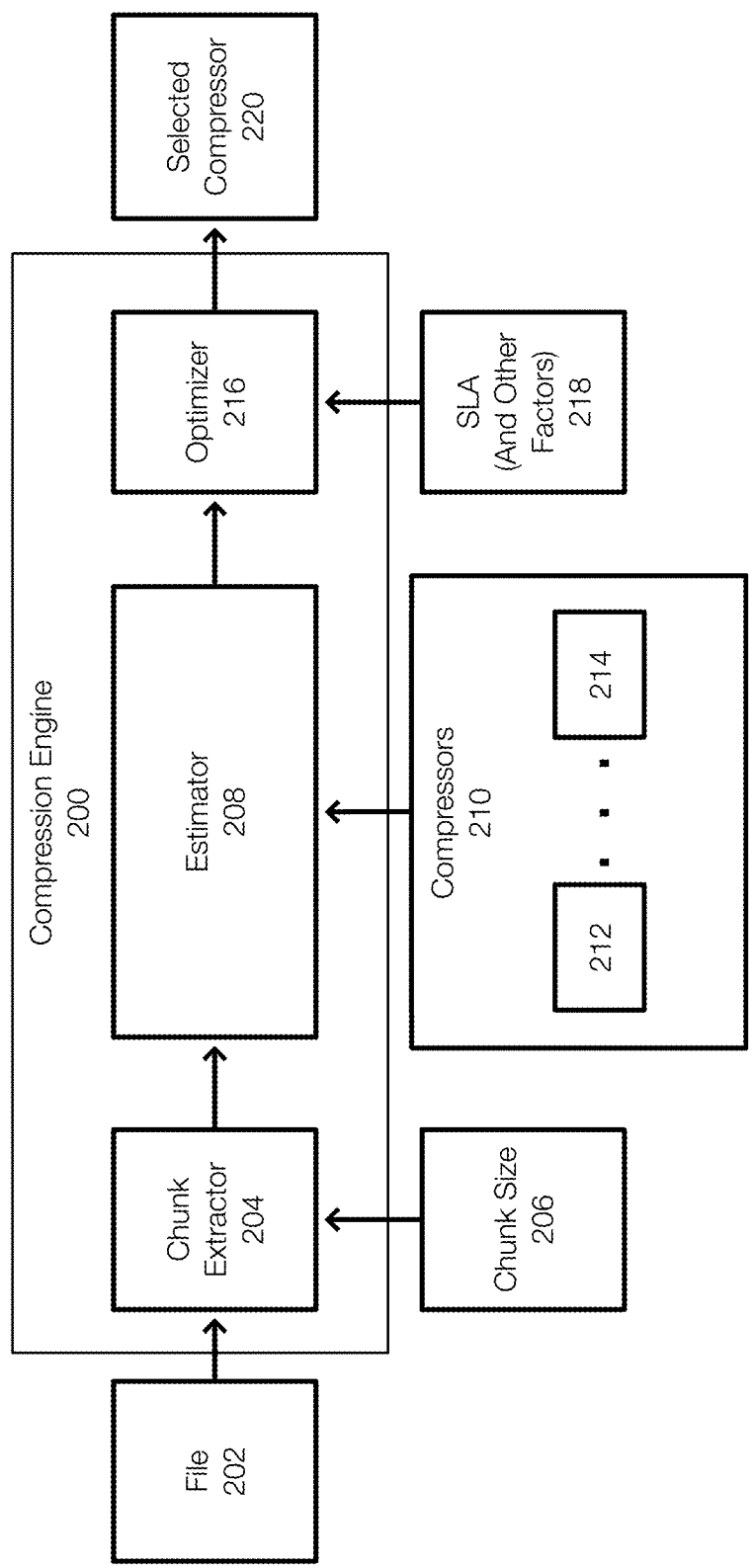
FIG. 2 discloses aspects of a system configured to select a compressor for a file based on smaller portions of the file.

FIG. 2 discloses aspects of a compression engine and discloses aspects of selecting a compressor and/or compressing the file. As previously stated, the process of selecting a compressor may be performed on a file-by-file basis. However, embodiments of the invention may also adapt by selecting a compressor for a group of files based on the compression metrics of a single file or chunk thereof.

FIG. 2 illustrates an example of a compression engine 200 that is configured to select a compressor for an input file. The compression engine 200 includes a chunk extractor 204 that is configured to extract a chunk from the file 202 for analysis. The size of the chunk may be determined by a chunk size 206, which may be variable, set by a user, based on file type, or the like or combination thereof.

The compression engine 200 includes an estimator 208 that is configured to generate compression metrics or compression performance metrics using the chunk extracted by the chunk extractor 204. The estimator 208 may generate compression metrics for multiple compressors 210 (represented by compressors 212 and 214).

Using smaller chunks to generate compression metrics rather than the whole file allows the estimator 208 to be orders of magnitude faster. In other words, generating compression metrics from chunks is less expensive computationally. The estimator 208 may generate compression metrics for each of multiple compressors by compressing the chunk with each of the available or valid compressors 210.

The optimizer 216 may consider an SLA 218 (and/or other factors) when selecting a compressor 220 to compress the input file 202. Thus, the selected compressor 220, which is one of the compressors 210, is selected based on compression metrics of a chunk, SLA constraints, and/or other factors such as application or context.

Figure 3:
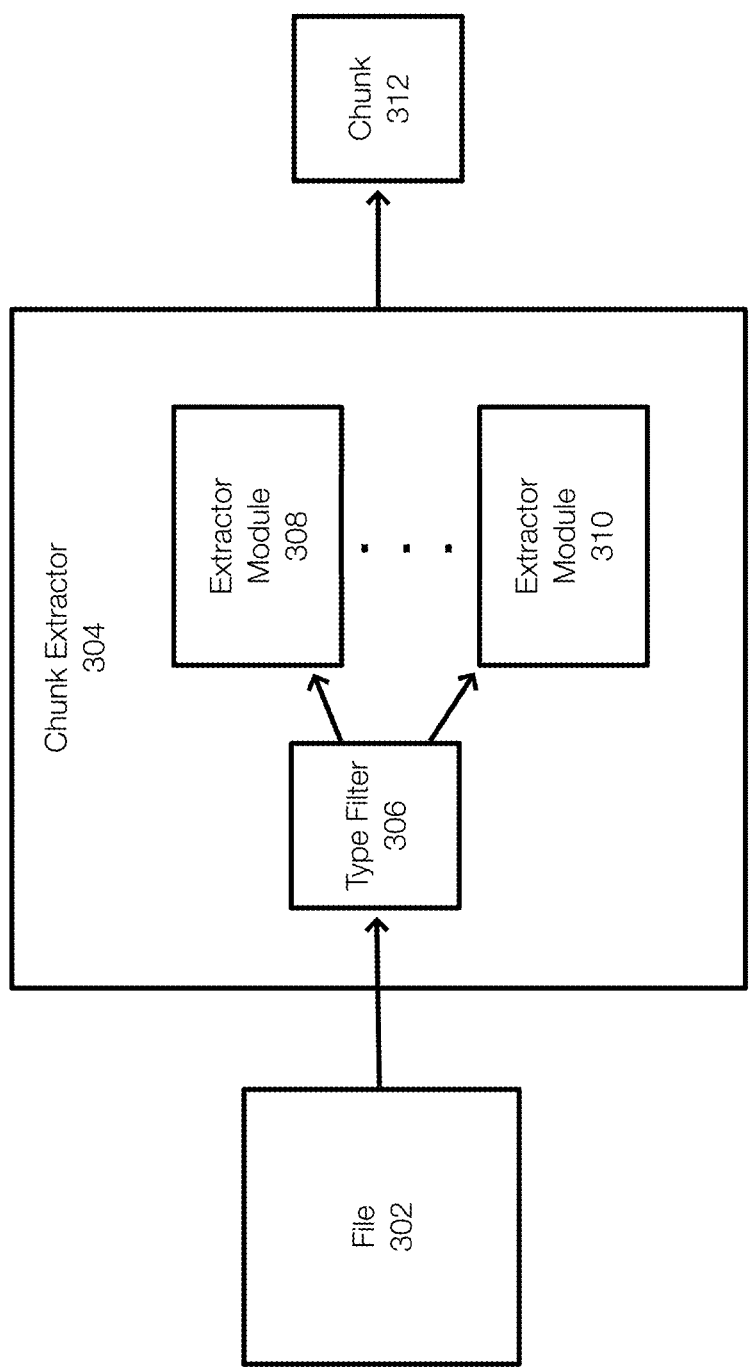
FIG. 3 discloses aspects of a chunk extractor that may be included in a compressor engine.

FIG. 3 discloses aspects of the chunk extractor. FIG. 3 illustrates an example of a chunk extractor 304 that is configured to extract a chunk 312 from the file 302. Each time a file is processed by a compressor engine, at least one chunk 312 is extracted from the input file. Embodiments of the invention may also scale (e.g., multiple extractors, multiple estimators, etc.) such that multiple files may be processed simultaneously and individually.

More specifically, the ability of the estimator to generate relevant compression metrics can depend on the ability of the chunk extractor 304 to extract relevant data from the file 302. Ideally, the chunk 312 contains data patterns that influence the compression metrics. In this example, the chunk extractor 304 may include a type filter 306. This example of the chunk extractor 304 is related to and based on file type. The type filter 306 may determine the file type and direct the file to the appropriate extractor module.

After the file type of the file 302 is determined by the type filter 306, the type filter 306 may identify a specific extractor module that is configured to extract a chunk from the identified file type of the file 302. In this example, the chunk extractor 304 includes n extractor modules, represented by modules 308 through 310. In this example, the ability to identify the file type allows a specific extractor that may be specifically configured for the identified file type to be used to extract the chunk 312 from the file 302.

Thus, the extractor module 308 may be used to extract chunks from a first file type (e.g., an audio file of type flac). The extractor module 310 may be used to extract chunks from another file type (e.g., an image file of type jpeg). The extractor modules 308 through 310 may each be configured to account for a different file type when a chunk is being extracted. In effect, the chunk extractor 304 implements a chunking strategy that is based on file type in this example.

The modules 308, 310 each understand a file format or type that allows the file to be parsed such that relevant information is extracted. For example, if the file 302 is a bitmap file, the chunk 312 extracted from the file 302 may be a bitmap chunk that can a be treated as a bitmap file. The chunk 312 is extracted such that the chunk 312 has a valid header, color table, or the like according to the file type. Thus, the chunk 312 respects the format of the file 302, including associated metadata.

The modules 308, 310 should also respect data alignment. For example, an RGB (Red, Green, Blue) image file includes data that represent pixels. As a result, a chunk from an RGB image file should be aligned to RGB pixel boundaries. The chunk should not break RGB triplets as this could impact the patterns exploited by the compressor.

Figure 4:
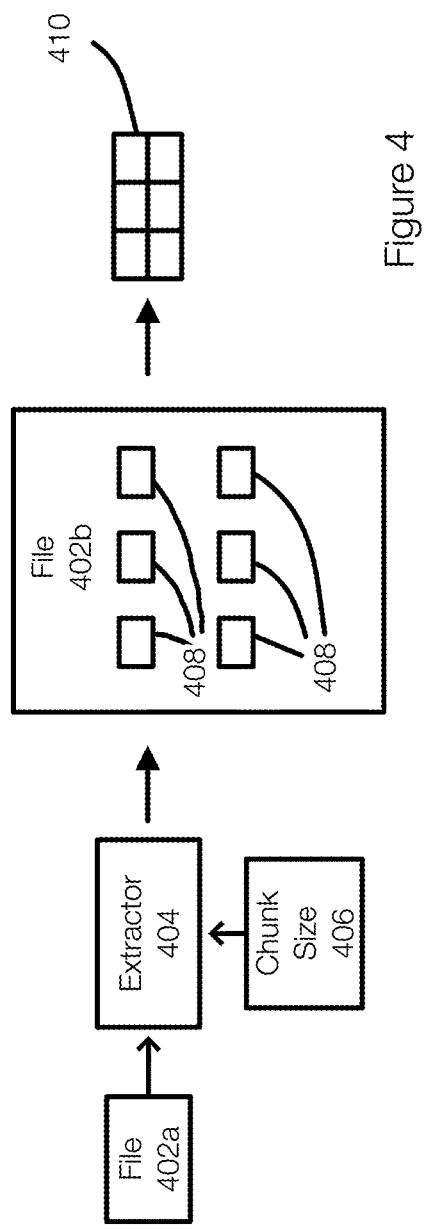
FIG. 4 discloses aspects of extracting a chunk from a file.

FIG. 4 illustrates an example of extracting a chunk from a file. FIG. 4 illustrates a file 402a from which a chunk 410 is being extracted. The file 402a is input into the extractor 404. The extractor 404 may identify the type of the file 402a and select a particular module to extract the chunk 410. The extractor 404 may also generate or extract a chunk whose size is determined by the chunk size 406, which may be an input to the extractor 404.

In one example, predefined locations 408 may be identified in the file 402b (which represents the file 402a as the chunk is being extracted). Thus, data is collected by the relevant extractor module from the locations 408 until the chunk size 406 is reached. The chunk 410 thus includes portions of the file 402b from one or more of the locations 408. However, the chunk 410 could be extracted from a single location in the file 402b. More generally, the location or locations from which the chunk 410 is extracted may be contiguous or non-contiguous with respect to the file 402b. This may be dependent on the file type and the configuration of the respective module. As previously stated, the chunk 410 is, in effect, a small file whose type is the same as the input file.

Once the chunk 410 is generated, the chunk may be compressed by each of the available compressors and compression metrics are generated for each compressor. The compression metrics can be used, at least partially, to select the compressor used to compress the whole file 402a.

Embodiments of the invention further establish a relationship between the compression metrics associated with a chunk to the compression metrics associated with the file as a whole. It is expected that the compression metrics for a chunk will be different from the compression metrics associated with the file as a whole. Embodiments of the invention relate to an estimator configured to generate estimated compression metrics that are representative of how the whole file will be compressed based on the chunk compression metrics. As described in more detail below, the compression metrics for a chunk are effectively corrected. The estimated file compression metrics, which are chunk compression metrics that are corrected using a correction factor, are an estimate of what would be achieved if the whole file were compressed.

In order to generate compression metrics, embodiments of the invention generate a model or set of models by running all available compressors on a set of training files. The set of training files may include files of different types. The set of training files also includes whole files and chunks of different sizes.

Figure 5:
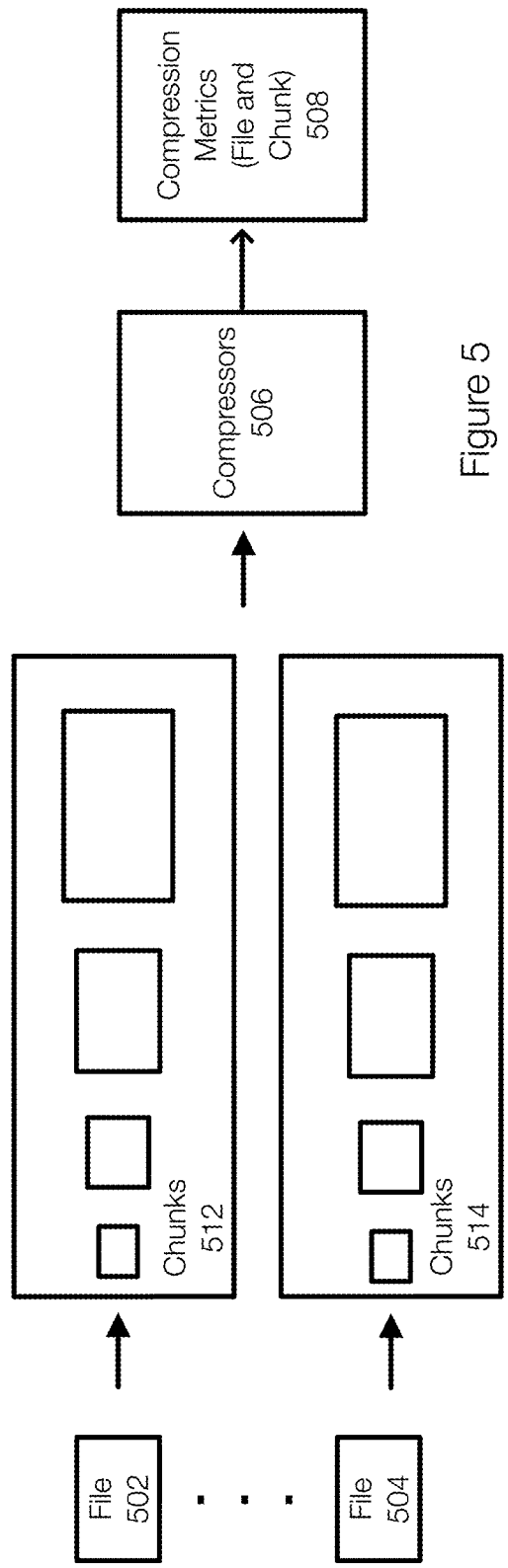
FIG. 5 discloses aspects of training data used for a model that infers compression metrics.

FIG. 5 discloses aspects of training a model and aspects of a set of training files. This example discusses processes associated with generating the training data. As a result, multiple chunks of each file are processed for training purposes. Once trained, only a single chunk is needed from a new file to select the best compressor.

In FIG. 5, the set of training files is represented by files 502 through 504. Each file may be processed, for example, by an appropriate extractor module, to extract chunks of different sizes. For each of N files in a set of training files, M chunks are extracted for each file. In this example, the file 502 may be associated with chunks 512 and the file 504 may be associated with chunks 514. Although the number of chunks is not limited, chunks may be generated in sizes from 1% to 100% in 1% increments. By way of example only and not limitation, the chunks range in size from 1 to 100 percent (a 100% chunk is the whole file). The files could have been chunked at other increments such as 5% increments.

When generating the model, all of the M chunks for each file are processed by all of the compressors 506. This allows compression metrics 508 to be generated for each of the chunks of each file in the set of training files. In one example, a compression ratio is an example of a compression metric. The compression ratio may be defined as the size of the original chunk to the size of the compressed chunk. Compression metrics may also include compression and decompression throughputs, which are computed as the size of the file or chunk divided by the time needed to compress or decompress the file or chunk. Processor usage and memory usage may also be included as compression metrics.

The compression metrics may include compression ratios between the uncompressed size and the compressed size. The training set includes N files, M chunks for each of N files, and O compressors. These are indexed ((a, j, k), where i indexes the file, j indexes the chunk, and k indexes the compressor). The compression ratios may be defined as:

$$\text{File compression ratio} - f_{ratio}(i, k) = \frac{\text{size (file)}}{\text{size (compressed file)}}$$

$$\text{Chunk compression ratio} - f_{ratio}(k, j, k) = \frac{\text{size (chunk)}}{\text{size (compressed chunk)}}$$

After running the compressors 506 on the set of training files and their chunks, training data is obtained and includes the compression metrics.

Figure 6A:
FIG. 6A discloses aspects of training data.

FIG. 6A illustrates an example of training data obtained from the set of training files. The table 600 illustrates a sample of the training data. The table 600 illustrates compression ratios for files that are compressed by multiple compressors. The table 600 also illustrates compression and decompression throughput. Similar data is obtained for each chunk of each file. For example, the first row for a 25% size chunk of a file results in a 2:1 compression ratio using the lossless JPEG compressor. The same file has a compression ratio of 1.3:1 when the 25% size chunk is compressed with the Gzip compressor.

To build a model or learn the relationships between the compression metrics obtained for the chunks and the compression metrics of the source files, these relationships are initially observed or determined from the training data.

Figure 6B:
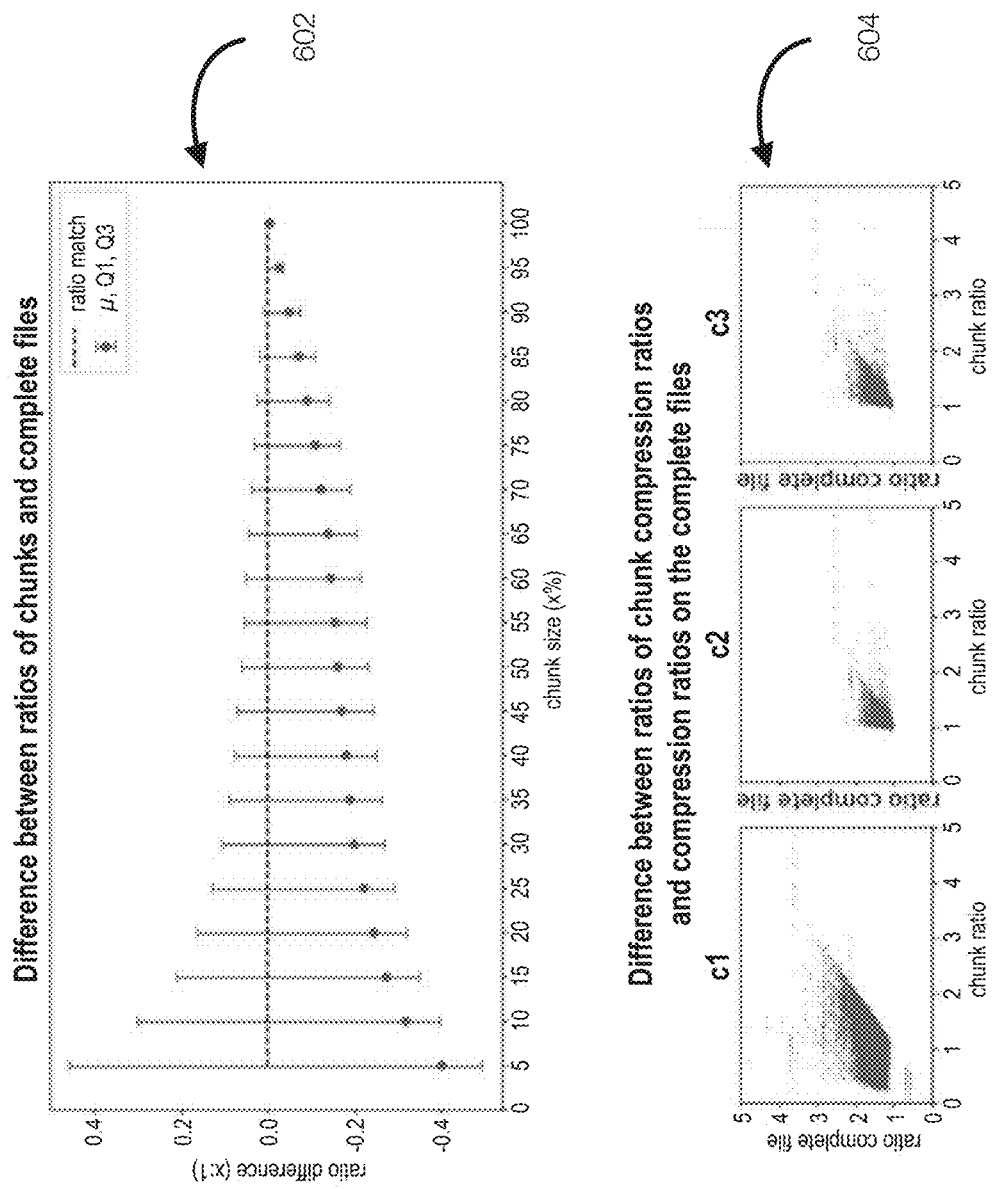
FIG. 6B discloses aspects of differences between chunk ratios and complete file ratios.

FIG. 6B illustrates differences between ratios obtained for chunks and ratios obtained for complete or whole files (100% chunk size). The graph 602 illustrates differences between the compression ratios for chunks of different sizes and the compression ratio of the full file. As illustrated in the graph 602, the differences become smaller as the relative sizes of the chunks increase. For example, the difference between the compression ratio of the whole file and the compression ratio of the 5% chunk is greater than the difference between the compression ratio of the whole file and the compression ratio of the 85% chunk. This is likely explained by the data patterns found in chunks relative to the data patterns found in the complete files. The graph 604 illustrates that the relationships between the chunk compression ratios and the full file compression ratios is not obvious. Generally and by way of example, however, the graph 602 illustrates that the compression ratios determined from chunks tends to underestimate the compression ratio of the whole file regardless of which compressor is used.

Embodiments of the invention further relate to a method for correcting the chunk compression ratio obtained with a compressor $c_k$ applied to chunk $S_j$ of file $f_i$ to find the compression metric on the file $f_i$. Thus, embodiments of the invention may determine a correction factor for each chunk size.

The correction factor is defined as follows in one embodiment:

$$r_{metric}(i, j, k) = \frac{\text{metric}(S_{i,j,k})}{\text{metric}(f_{i,k})}$$

Using the training data, the correction factor is a ratio between the compression metric of the chunk to the compression metric of the file. In one example, the correction factor is configured to adjust the compression metric of a chunk to match the co compression metric of the whole file. As previously stated, the training data in the graph 602 illustrates that the compression ratio of the chunks underestimates the compression ratio of the whole file. Thus, the correction factor allows the measured compression metric of a chunk to be corrected to obtain an estimated file compression metric, which is likely closer to the true compression metric of the whole file.

Figure 6C:
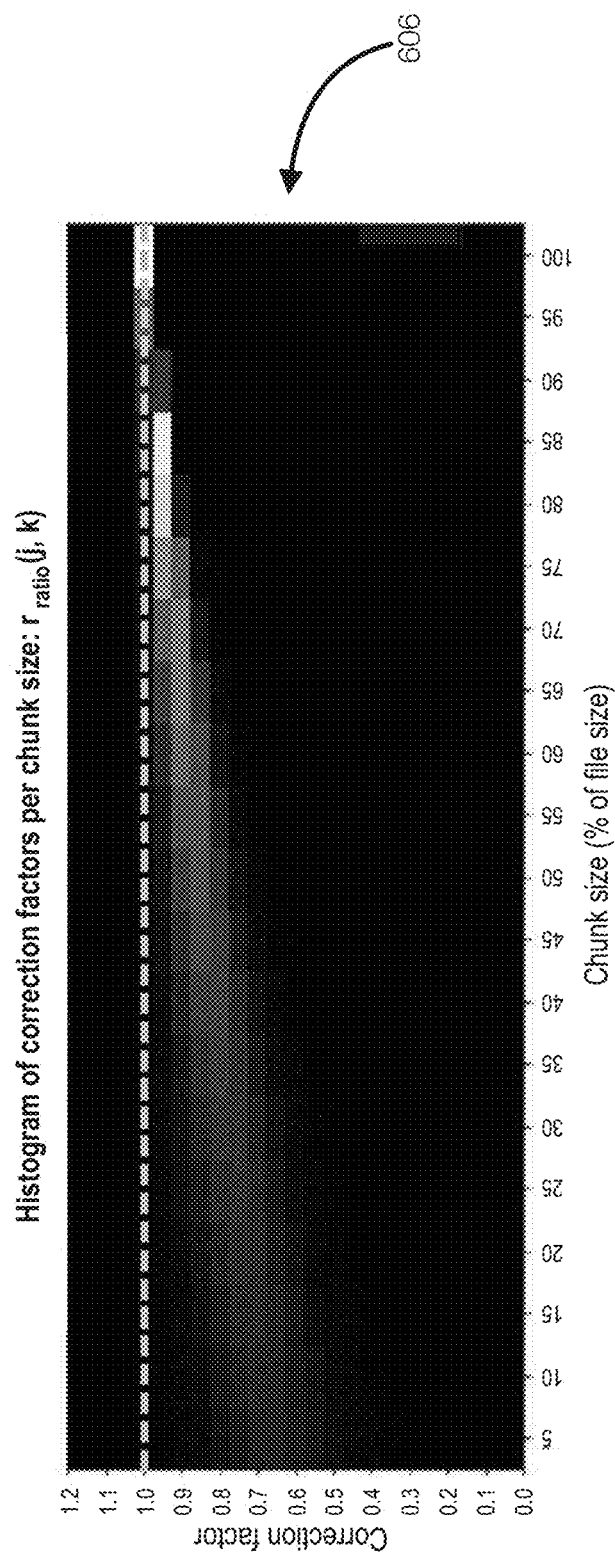
FIG. 6C discloses aspects of a histogram of correction factors.

FIG. 6C discloses aspects of a histogram of correction factors. The histogram 606 illustrates correction factors of compression ratios $r_{ratio}$ for a compression algorithm $c_k$ on all relative chunk sizes of a training set. As illustrated in the histogram 606, the correction factor tends to 1 as the chunk size approaches the whole file size.

This relationship is learned via a model derived from the training data. The model is expected to show, for each compressor and each relative chunk size, the relationship between the chunk compression metric and the file compression metric.

In one example, a mixture of Gaussian functions are fit on the training data of each chunk size, for each compressor. The model for each compressor will be a set of normal functions, where $\mathcal{N}_{j,k}(\mu^T, \Sigma)$ represents the mixture of Gaussian functions for compressor $c_k$ and relative chunk size j.

In one example, the parameters of each mixture of Gaussians may be application dependent. By way of example only, a Bayesian Gaussian Mixture model may be used:

$$\Theta(c_k) = \{\mathcal{N}_{j,k}(\mu^T, \Sigma) \forall j \in [1, \ldots, M]\}.$$

Figure 6D:
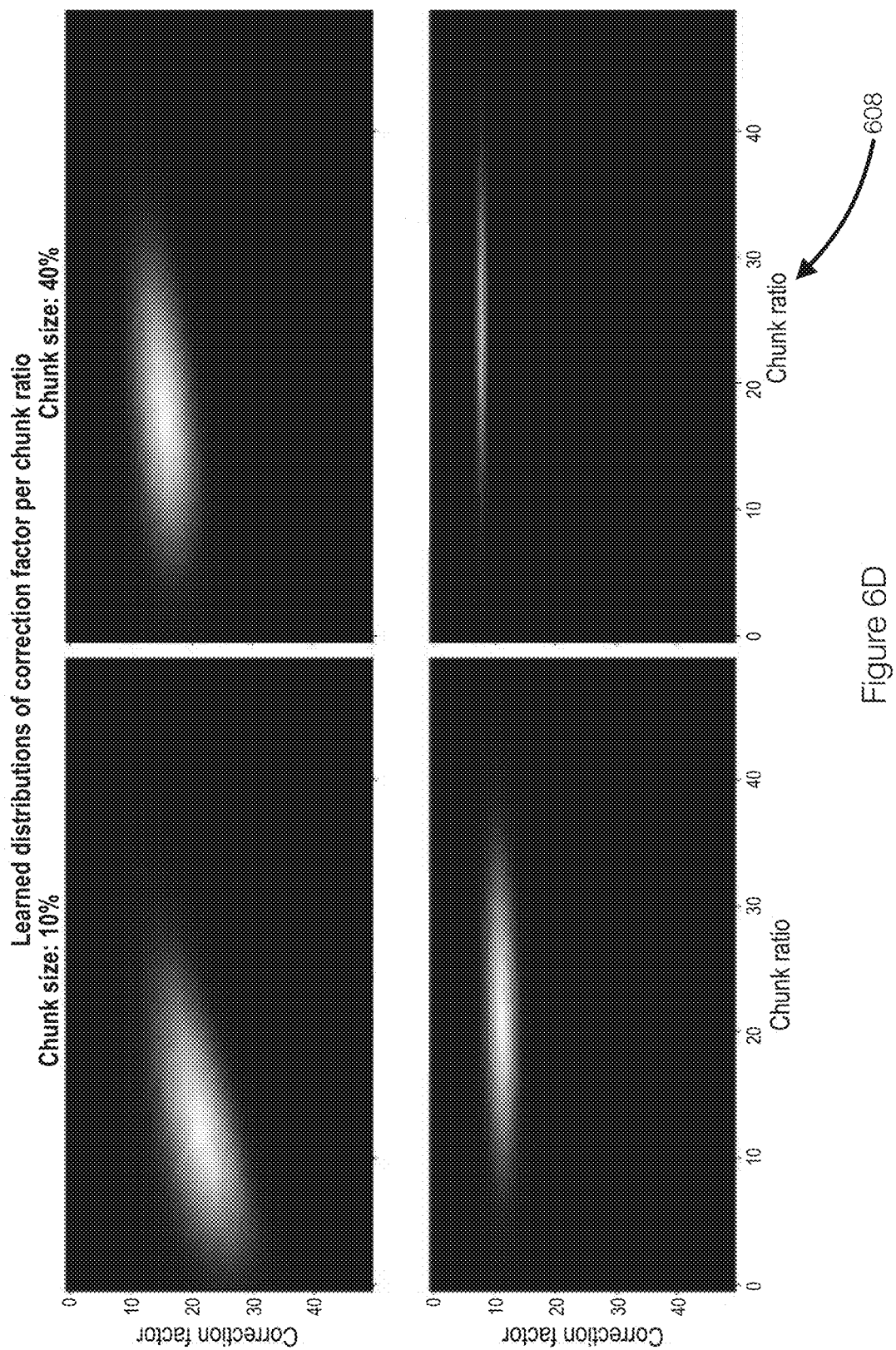
FIG. 6D discloses aspects of learned distributions of chunk compression ratios and correction factors of compression ratios.

FIG. 6D discloses aspects of learned distributions of chunk compression ratios and correction factors of compression ratios. The distributions 608 are examples of learned distributions of chunk correction factors of compression ratios, $r_{ratio}$, for a compression algorithm $c_k$ on all chunks of a given size. In this example, the correction factors tend to 1 as the chunk size approaches 100% of the size of the source files. The learned distributions illustrated in FIG. 6D include distributions for chunk sizes of 10%, 40%, 70% and 100%.

Figure 7A:
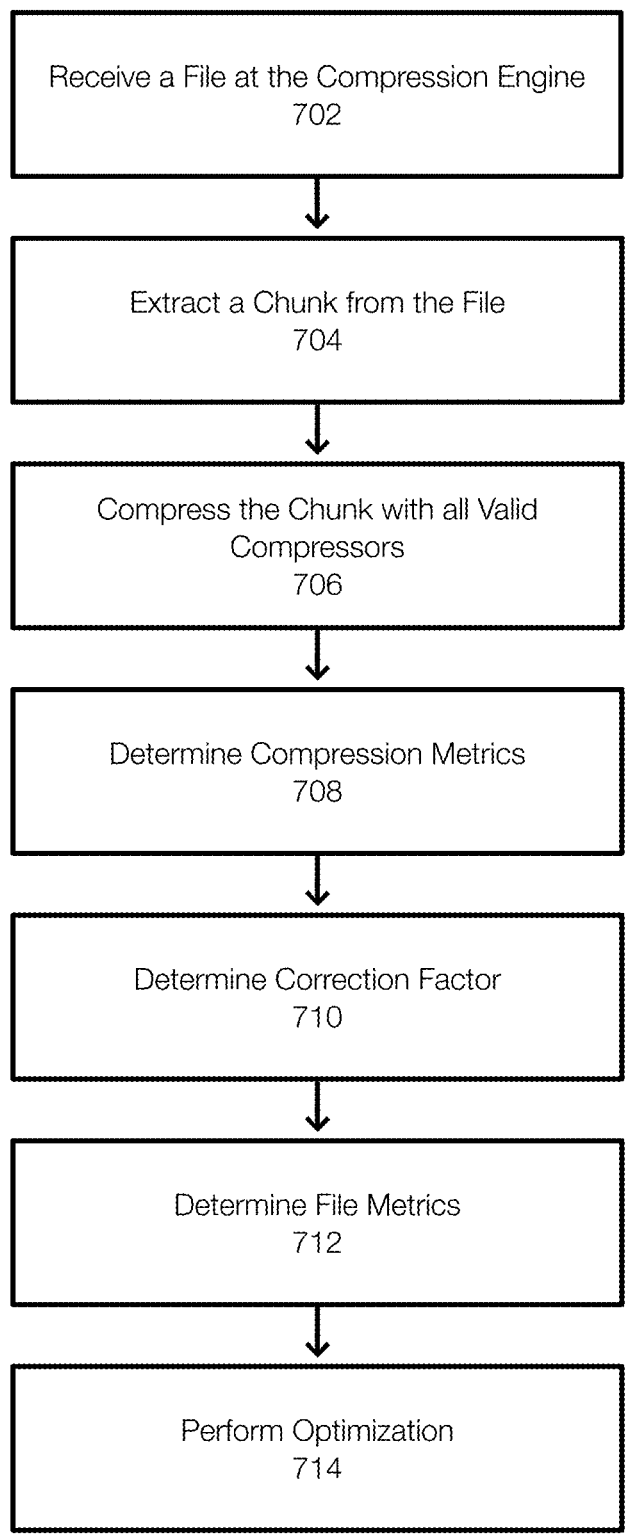
FIG. 7A discloses aspects of a method for selecting a compressor for a compression operation.

FIG. 7A discloses aspects of compression operations. More specifically, after learning the joint probability density functions, a compression engine is now prepared to estimate compression metrics on a new file $f_{new}$ using the compression metrics obtained from the compression of small chunks $S_{new,j}$. The estimated compression metric for the new file will be generated by correcting the compression metrics obtained from a chunk of the new file with the correction factor.

In this example, a new file is received 702 at a compression engine that has been trained or prepared using the set of training files and the training data obtained therefrom. Receiving the file may include determining a file type such that a specific extractor module may be used based on the file type to extract a chunk therefrom. The extractor may include multiple modules that are each configured for a different file type.

Once the file type is determined, a chunk is extracted 704 from the new file using one of the modules. As an example, the size of the chunk extracted from the new file may be 5% of the size of the new file. As previously stated, smaller chunks have the advantage of increased efficiency at least from a computational perspective.

Next, the extracted chuck is compressed 706 with all available compressors. More specifically, the extracted chunk is compressed with all valid compressors for the file type. For example, an image file may be compressed with image-specific compressors such as FLIF Lossless JPEG, TIFFLzw, TIFFZip, and generic lossless compressors such as gzip, lzma, bzip, or the like. Compressors that are configured specifically for other file types may be omitted. Because the size of the chunk is small compared to the size of the new file, running all of the valid compressors takes a fraction of the time that would be required to run all of the valid compressors on the whole file.

After all of the valid compressors have been run on the extracted chunk, compression metrics are determined 708 for each compressor. The chunk compression ratio may be expressed as follows for the valid compressors:

$$s_{ratio}(\text{new}, 5\%, k) = \frac{\text{size (uncompressed chunk)}}{\text{size (compressed chunk)}}$$

Once the compression metrics have been determined for the chunk for each of the valid compressors, the correction factors may be determined 710. In one example, the correction factors are based on the joint probability distributions generated from the set of training files.

The correction factors are then used to determine or estimate 712 file metrics or file compression metrics. File metrics, which may identify the amount of compression expected for the new file, can be determined for each compressor based on the corresponding correction factors and the chunk compression metrics. By relying on the actual compressors, embodiments advantageously avoid any need for custom or type dependent feature engineering. Further, the chunks are valid files (the extracted chunks comply with the file format) for input to the compressors and the compression of the whole file can be estimated based solely on previous compressions of chunks of similar relative size.

Embodiments of the invention further model the distributions for multiple relative sizes. This gives flexibility to embodiments of the invention. For example, applications that require higher precision in the estimations may choose to extract larger chunks from the files. If larger chunks are extracted, there may be a performance impact because it takes longer to perform the compressions. As a result, embodiments of the invention allow users or application to select the appropriate or desired chunk size.

Once the file metrics are determined or estimated, optimization is performed 714 to select a compressor. The optimization may account for other factors such as context and SLA constraints in addition to the estimated file metrics. The optimization may select a compressor based on the estimated file metric, compression throughput, decompression throughput, application, and/or other constraints. In one example, a weighted performance function, P, for a compressor $c_k$ over a set of compression metrics M may be defined as:

$$P(c_k \mid w) = \sum_{i \in M} w_i * \hat{f}_i(\text{new}, k) = \langle w, \hat{f}_{metric}(\text{new}, k) \rangle$$

In one example, the efficiency function is a dot product between the estimated compression metrics for the new file $f_{new}$ and weights w associated with the SLA constraints related to each compression metric of interest. In one example, the selected compressor is:

$$C^* = \underset{c_k \in C'}{\operatorname{argmax}} P(C_k \mid f_{new}, w).$$

In a maximization function, C' is a set of all valid compressors for file $f_{new}$, which may be a subset of C.

Figure 7B:
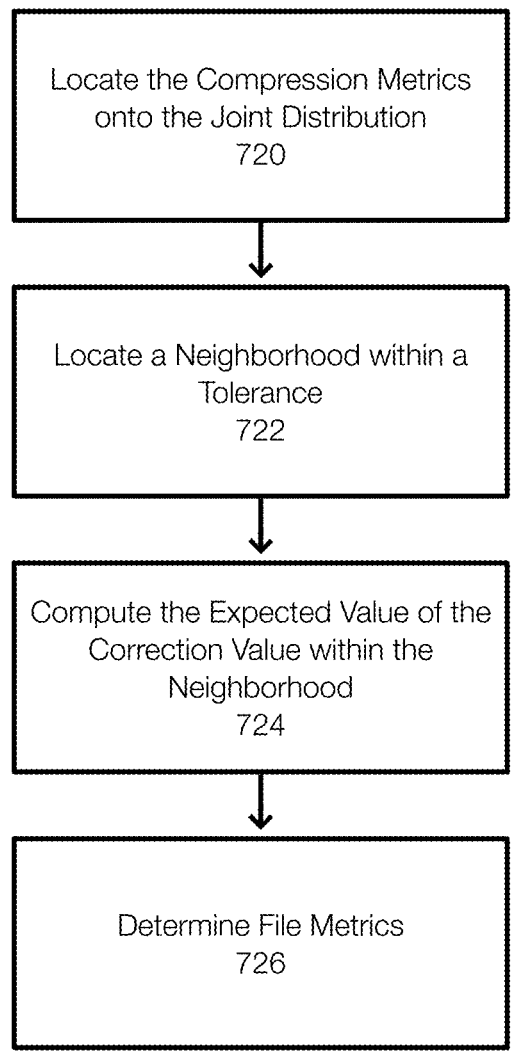
FIG. 7B discloses aspects of determining a correction factor.

FIG. 7B further illustrates an example of determining a correction factor (which may be a ratio or other value). Determining the correction factor is an example determining or inferring the estimated file metrics for a new file based on the training data.

Figure 7C:
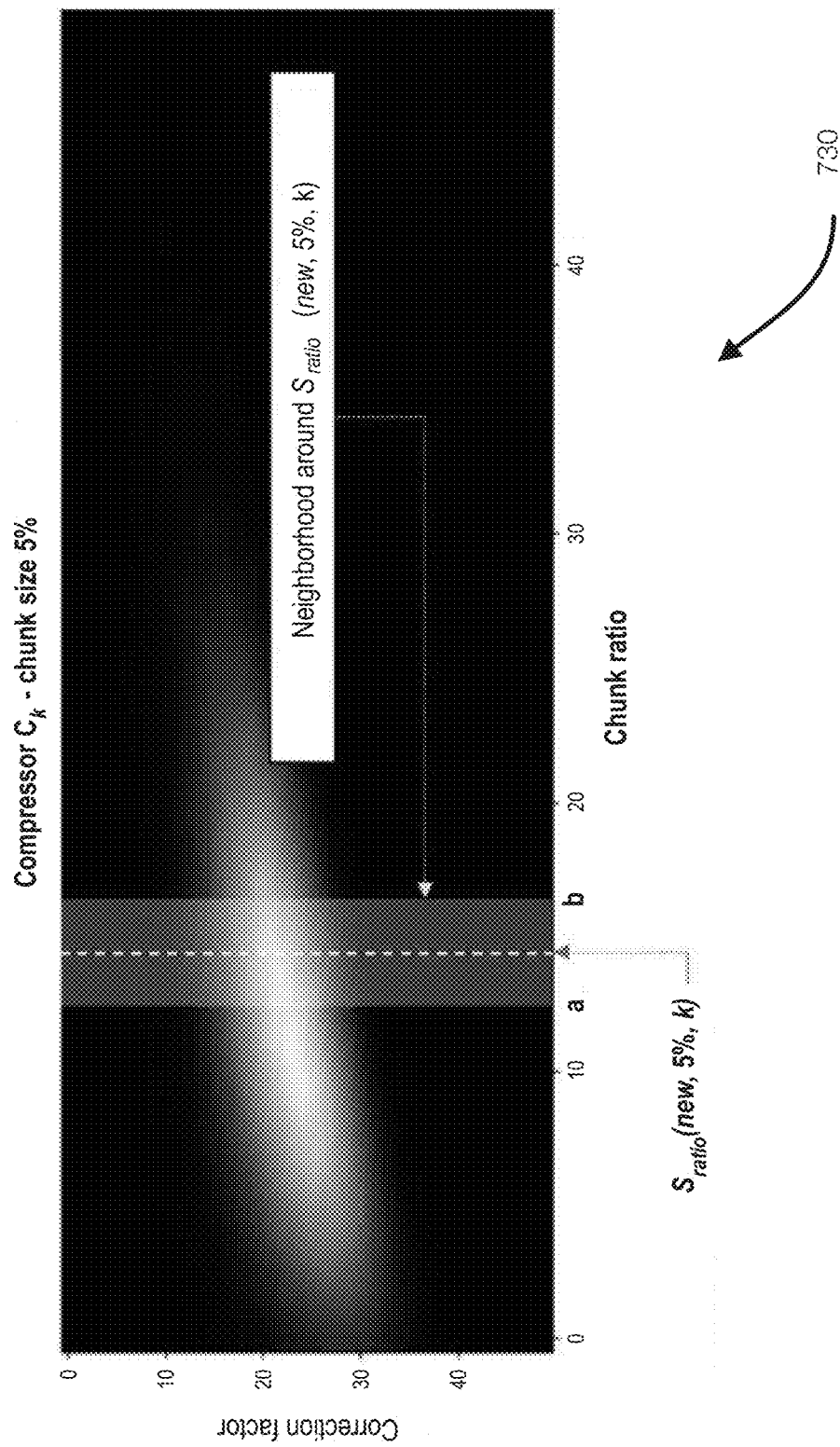
FIG. 7C discloses aspects of a joint distribution.

Initially, the compression metrics for the chunk are located 720 onto the joint distribution for each compressor for the relevant chunk size. FIG. 7C illustrates a joint distribution 730 and illustrates locating the compression metrics of a chunk onto a joint distribution, which is defined as, in one example:

$$\mathcal{N}_{5\%,k}(\mu^T, \Sigma)$$

More specifically, FIG. 7C illustrates a metric $s_{ratio}$(new, 5%, k) located onto the distribution of compression ratios and correction factors. In addition, a neighborhood is also located 722 around the metric $s_{ratio}$(new, 5%, k), which is within an application defined tolerance in one example with limits [a,b]. The neighborhood is determined by these limits in one example.

Next, the expected value of the correction factor within the neighborhood around the metric $s_{ratio}$(new, 5%, k) is determined. In one example, this is equivalent to computing an integral over intervals:

$$r_{metric} \in [-\infty, +\infty] \text{ and } s_{metric} \in [a,b].$$

An example of the integral is:

$$\hat{r}_{metric}(\text{new}, 5\%, k) = E(r_{metric}) \big|_a^b$$

$$= \int_{-\infty}^{+\infty} \int_a^b r_{metric} \mathcal{N}_{5\%,k}(r_{metric}, s_{metric} \mid \mu^T, \Sigma) dr ds$$

The interval [a,b] around $s_{ratio}$(new, 5%, k) is used, in one example, because every compressor exploits some pattern of the input file. Thus, chunks with similar patters may result in similar compression metrics for a given compressor, which leads to similar correction factors. By computing the expected value of $r_{metric}$ inside the interval, a content-aware approach that improves the quality of the estimated correction factors is achieved.

Figure 7D:
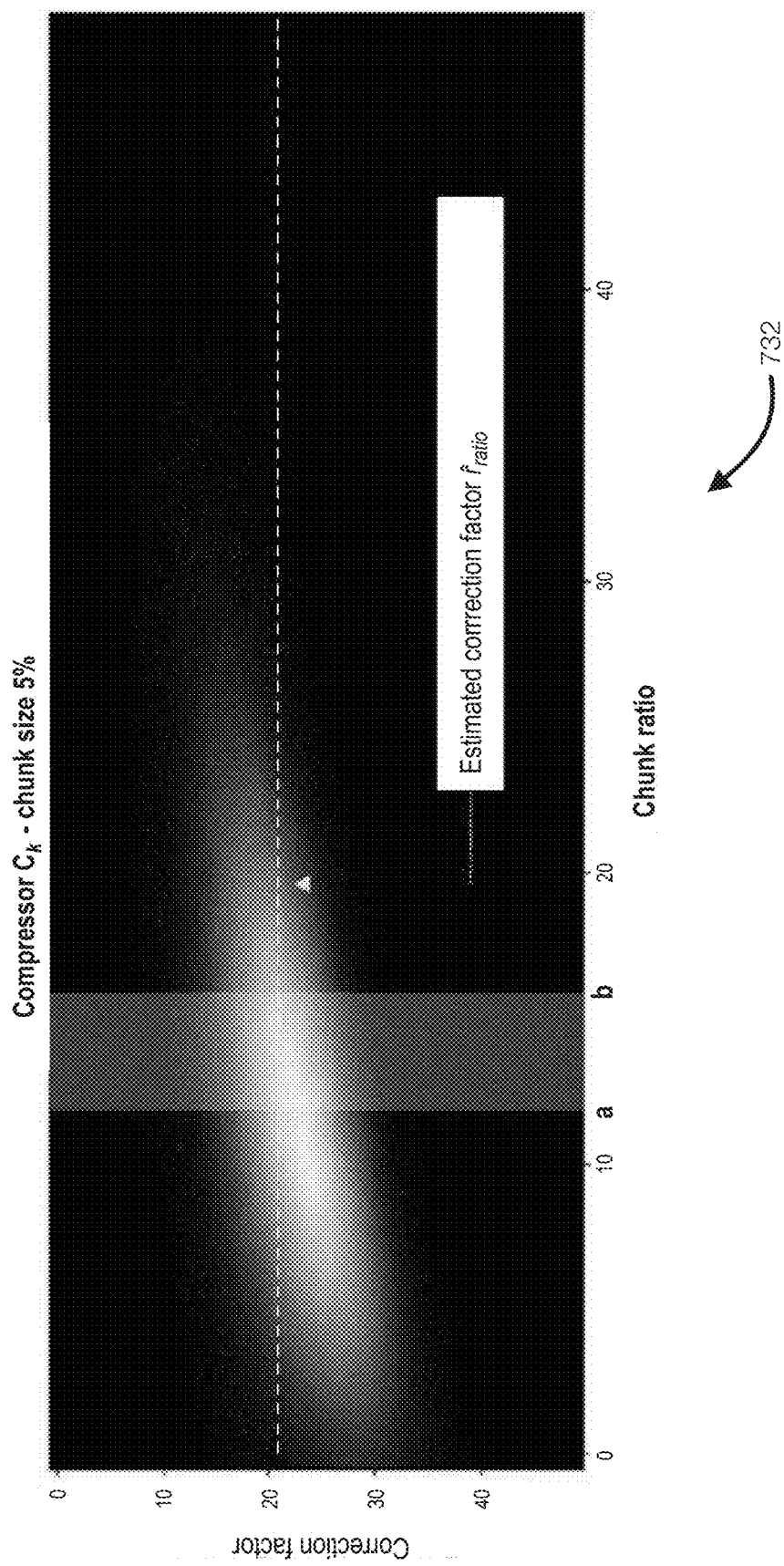
FIG. 7D discloses aspects of estimating the correction factor to be applied on a compression metric.

FIG. 7D illustrates an example of estimating the correction factor to be applied on a compression metric. The estimate corresponds to the expected value of the correction factor inside the neighborhood of $s_{ratio}$(new, 5%, k).

Next, file metrics are estimated or determined 726. For each compressor, estimates of the compression metrics on the complete file $f_{new}$ are determined by applying the estimated correction factor to the metrics obtained for the chunk. This is reflected as follows:

$$\hat{f}_{metric}(\text{new}, k) = \frac{s_{metric}(\text{new}, j, k)}{\hat{r}_{metric}(\text{new}, j, k)}.$$

The file metric $\hat{f}_{metric}$(new,k) can be used during optimization as previously discussed.

In some embodiments, all valid compressors are executed on the extracted chunks. For small chunks, the generation of the correction factors and estimation of the file metrics may be fast. However, the fitted probability distributions on relatively small chunk sizes may have more uncertainty or variance. Even though embodiments of the invention can correct any deviation from the compression metrics on the complete files, the balance between the speed of execution and estimation precision may be considered.

Embodiments of the invention thus select the best compression algorithm or compressor to be used on a file based on the contents of the file, the type of the file, and/or user or application specific SLA constraints. Embodiments of the invention can select the best compressor based on patterns found in files or chunks rather than strictly on file type.

The following examples illustrate embodiments of the invention and are discussed with respect to FIGS. 8A-9E. Color copies of FIGS. 8A-9E are included in an appendix, which is incorporated by reference in its entirety.

Figure 8A:
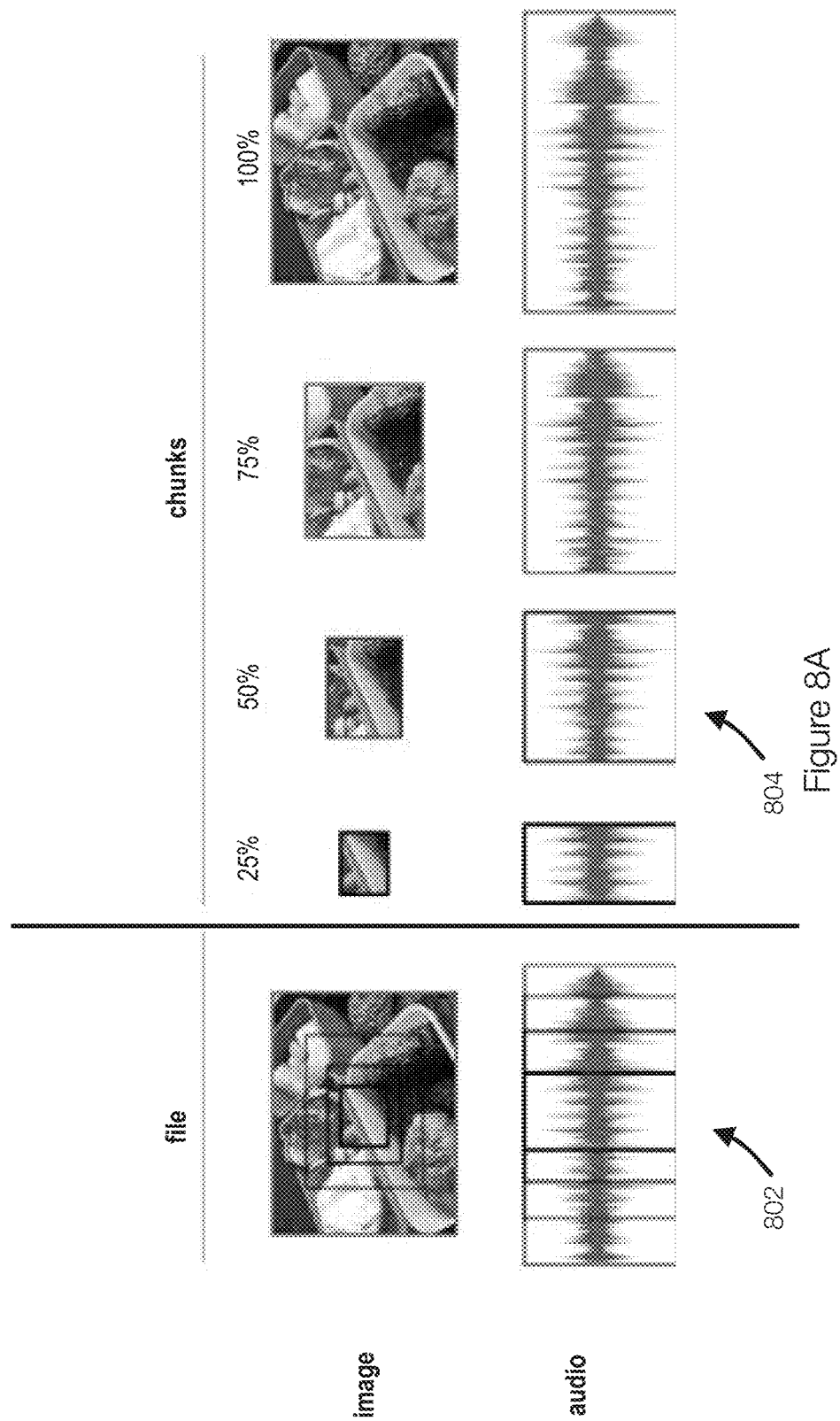
FIG. 8A illustrates examples of files and associated chunks of different sizes.

In this example, a training set of files includes a set of image files and a set of audio files. From each of these files, chunks were extracted. The sizes of the chunks began at 5% and increased at increments of 5%. FIG. 8A illustrates an example of an image file and an audio file (files 802 are representative of all files in the set of training files) and illustrates selected chunks 804 from each of these files. FIG. 8A illustrates that the chunks were selected from a center point (e.g., a seed point) of the files. The chunks may be extracted by an extractor module included in the extractor.

A training set of data is generated by compressing all of the chunks 804 from all of the files 802. In one example, a set of lossless compressors are used to generate the compression metrics. Some compressors are parametrizable. As a result and by way of example, distinct configurations of a specific compression algorithm may constitute a distinct compressor for purposes of generating the training set of data and selecting the best compressor. For example, the audio chunks 804 were compressed using the following compressors:

flac0—a Lossless Audio Codec;
gz1 and gz9—gzip compression, based on DEFLATE algorithm, in the lowest and highest compression levels; and
lzma0 and lzmaExtreme—compressors implementing Lempel-Ziv-Markov chain algorithm parametrized with presets for low memory usage (fastest but lowest compression ratio) and for highest compression ratio (slower, and with higher memory usage), respectively.

In this example, only the flac0 compressor is a type-specific compressor. The gzip and lzma algorithms are generic compressors.

For image files, six representative compressors were used:
JPEG2000—an implementation of the JPEG2000 lossless compression;
TIFFLzw and TIFFZip—Tag Image File Format compression in LZW and zip modes, respectively;
flif100—a Free Lossless Image Format compressor; and
lzma0 and lzmaExtreme—same as for the audio files, as described above.

Assuming that there were 1713 image files and 1432 audio files in the training set of files, generating the training set of data required 171,300 audio chunk-compressions (1713 files×20 chunks×5 compressors) and 171,840 image chunk-compressions (1432 files×20 chunks×6 compressors). Compression metrics for these chunks were computed.

With the resulting training data, a model was built as previously described. This resulted, as illustrated in FIG. 8B, distributions 806 of chunk compression ratios by chuck size for each compressor for the audio files in the training set of files.

Figure 8B:
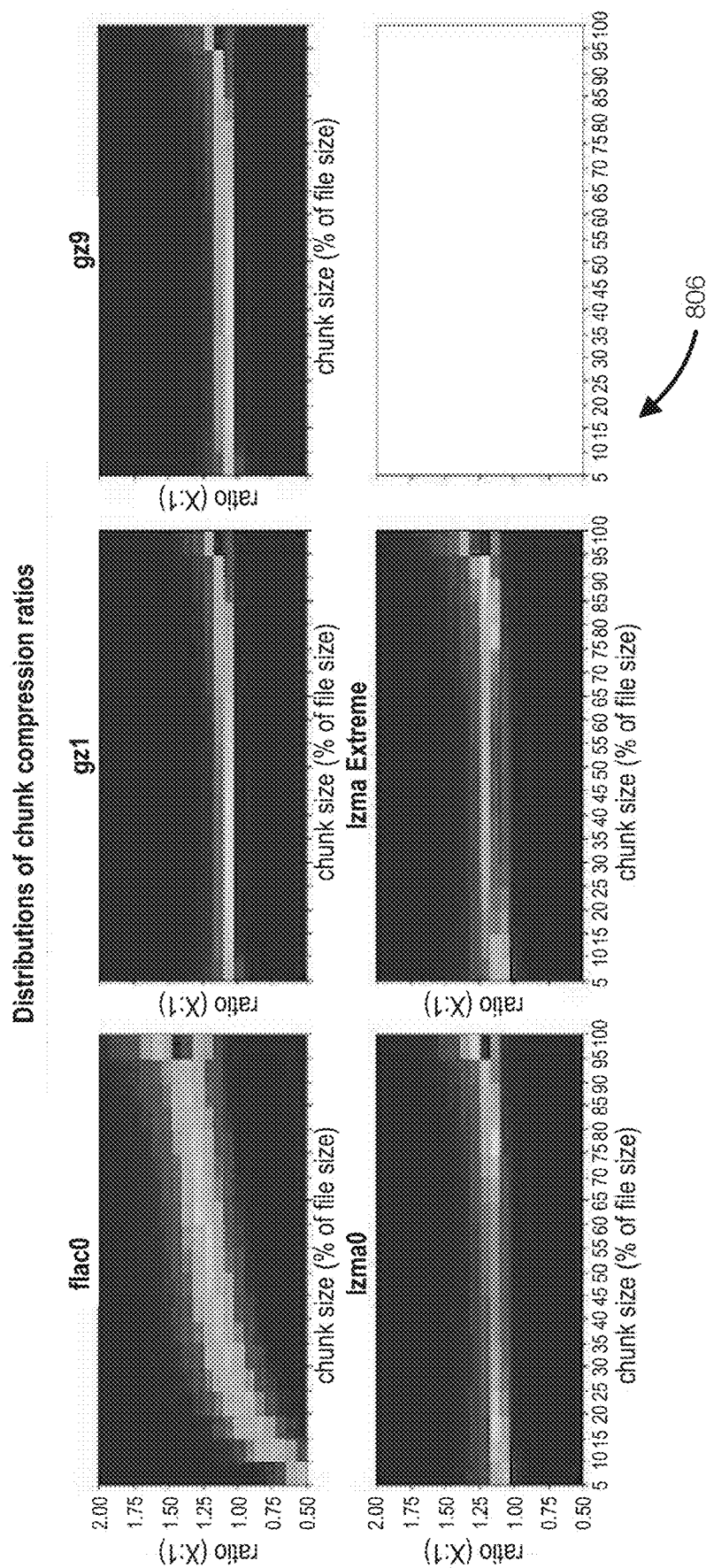
FIG. 8B discloses aspects of distributions of chunk compression ratios.

As illustrated in FIG. 8B, the compression ratios obtained for the chunks using a type-specific compressor (flac0) varies according to the chunk size more drastically than when using generic compressors. In this example, although flac0 obtains the overall highest compression for the full file (100% chunk size), the flac0 performs poorly for small chunk sizes. In fact, some of the ratios are smaller than 1 (the compressed data is larger than the original data).

Figure 8C:
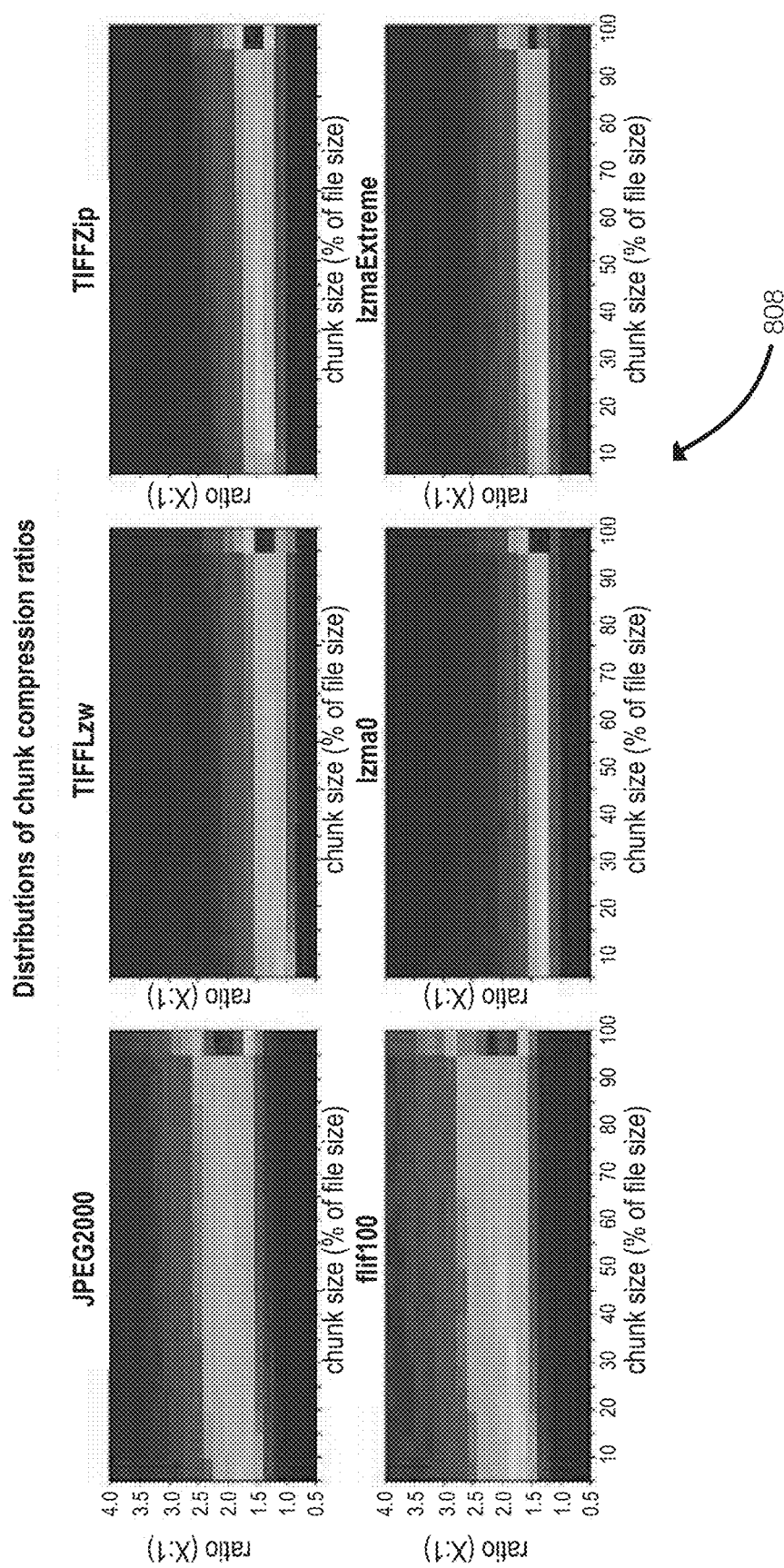
FIG. 8C discloses aspects of distributions of chunk compression ratios.

FIG. 8C illustrates distributions 808 of chunk compressions by chunk size, for each compressor, for image files in the training set. The distributions 808 illustrate that the compression ratios obtained for the smaller chunks of image files are much more similar to the compression ratios obtained for the full files, regardless of compressor. However, there is high variability in the compression ratios obtained from different compressors, which demonstrates that the relationship between chunk ratios and ratios on complete files is not obvious.

Figure 8D:
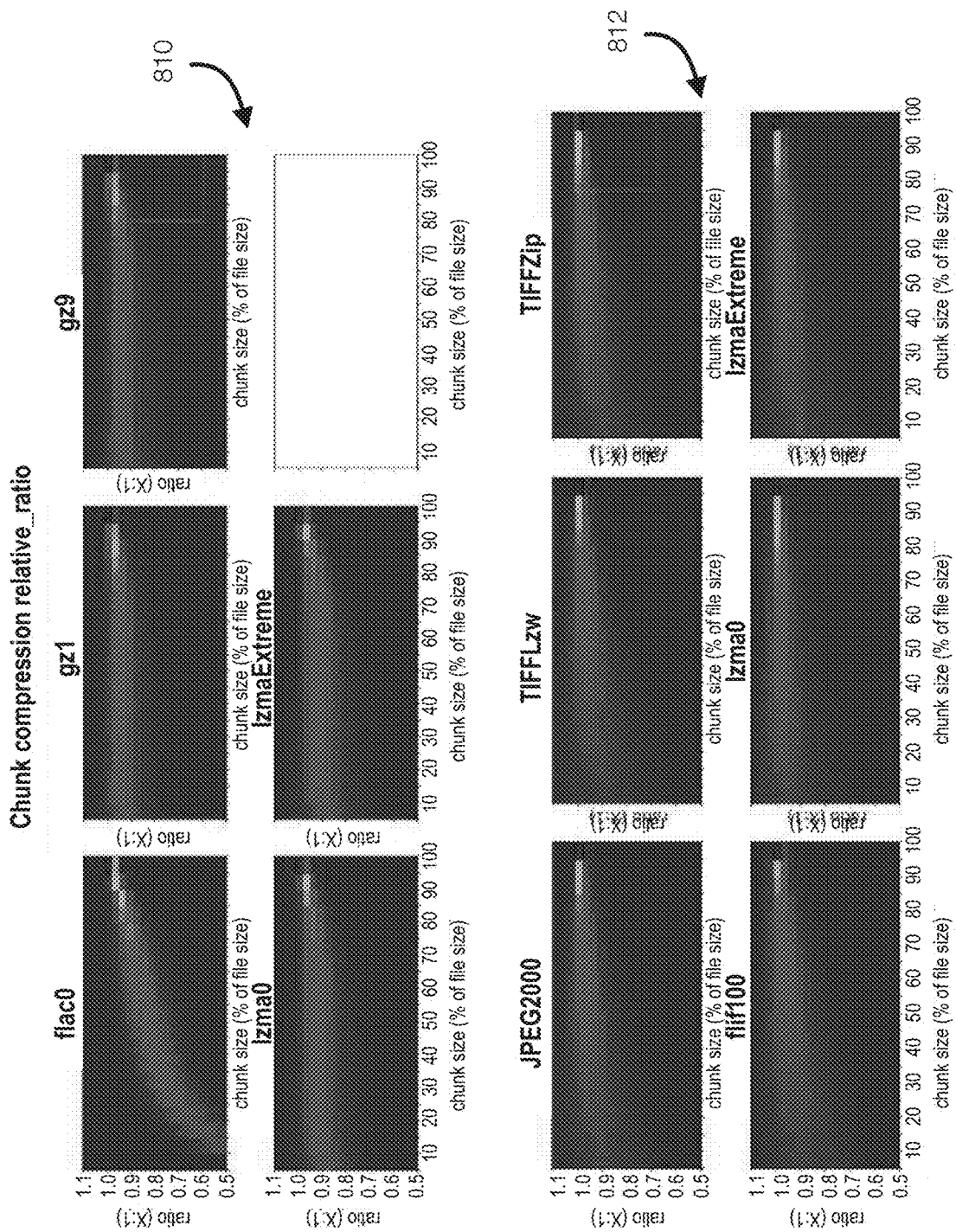
FIG. 8D discloses aspects of chunk compression relative ratios and distributions of chunk compression ratios.

FIG. 8D illustrates the relative compression ratios 810 of the chunks over the full file compression ratio for audio files in the training set and compression ratios 812 of the chunks over the full file compression ratio for image files in the training set.

Figure 8E:
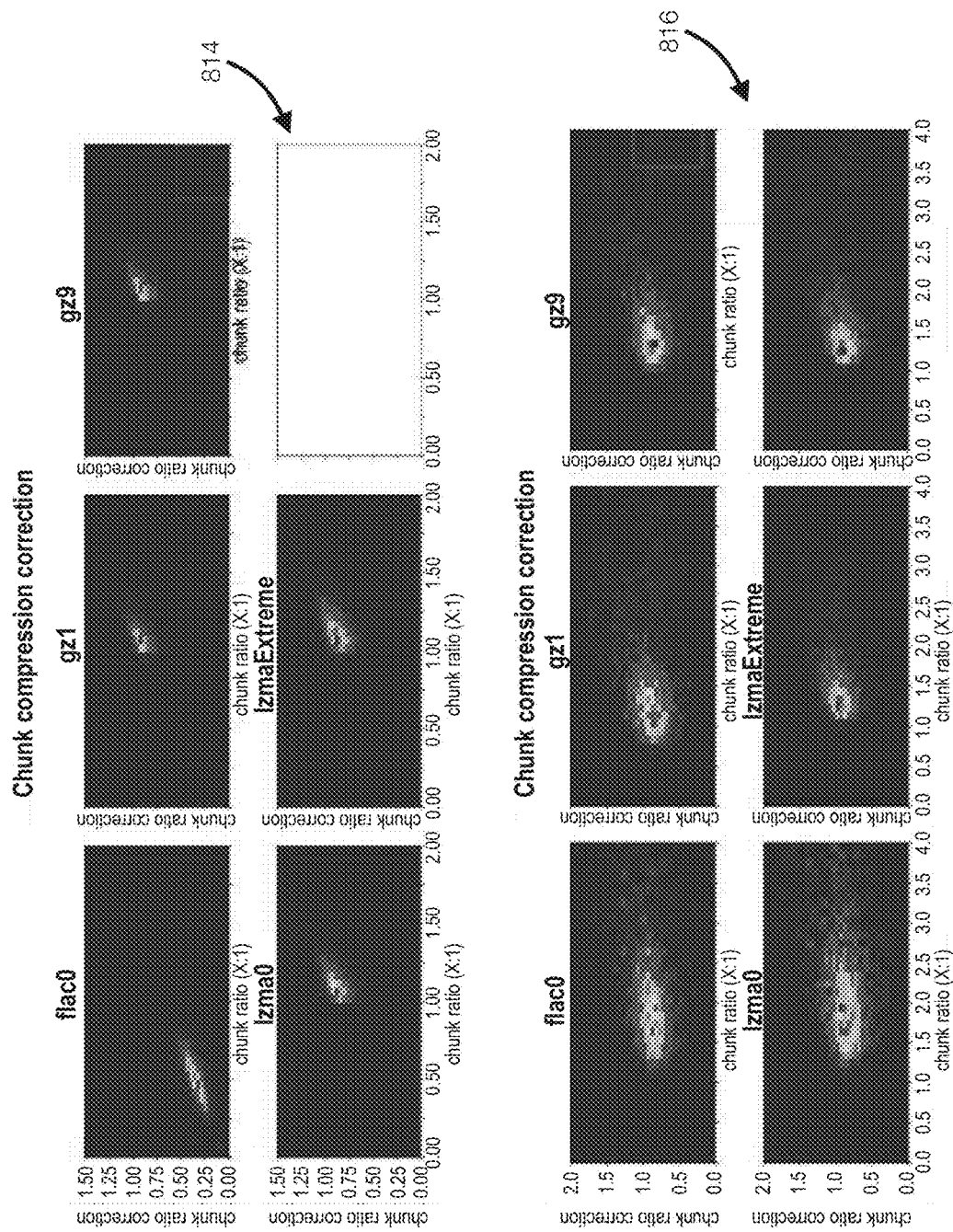
FIG. 8E discloses aspects of chunk compression correction factors.

FIG. 8E illustrates the learned joint distributions 814 of chunk compression ratios and correction factors of compression ratios for each compression algorithm on all chunks (for chunk size of 5%) of audio files in the training set and the learned joint distributions 816 of chunk compression ratios and correction factors of compression ratios, for each compression algorithm on all chunks (chunk size of 5%) of image files in the training set.

Once the learned joint distributions are generated, this example proceeds to determine or estimate compression metrics for new files and to select the optimal compressor for the new files. In these example experiments, the new files include 500 files of each type (image and audio). These new or test files were selected from the same datasets from which the training set of files were selected. These test files were not used to train the probabilistic models.

In a practical application, a chunk of a pre-determined size (e.g., 5%) from a single new file would be extracted and the correction factor for each compressor would be estimated based on the distributions generated from the training data. For validation purposes, however, this process is performed exhaustively for the test files. Thus, each of the test files is chunked into all chunk sizes and each of these chunks is compressed with each compressor—similar to the training stage. In addition, the whole test files (100% chunk size) are compressed to determine the actual or true compression metrics for the files.

Figure 9A:
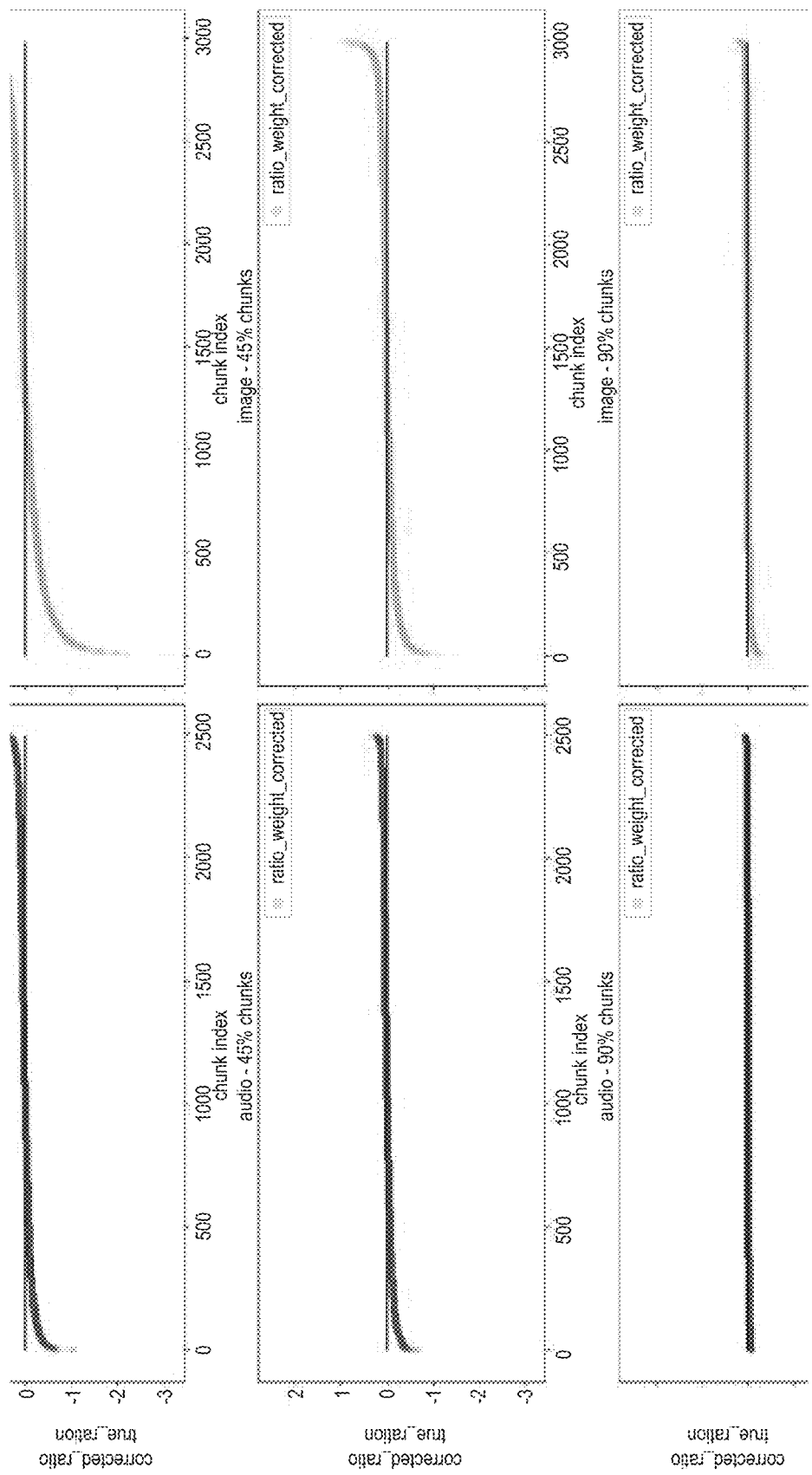
FIG. 9A discloses aspects of differences between true compression ratios and corrected ratios.

After applying the correction factor to the chunk compression ratios, it is possible to compare the estimated file compression metrics or ratios generated by embodiments of the invention to the actual file compression metrics of the whole file. Some results for the test set—for chunks of 5%, 45% and 90%—are shown in FIG. 9A, which compares, for each chunk (x-axis), the obtained corrected ratio to the true ratio (y-axis). FIG. 9A illustrates that for larger chunks (e.g., 90% chunks, bottom graphs) the estimated ratio is, expectedly, much closer to the true compression ratio. For smaller chunks (e.g., 5% chunks, top graphs) the corrected ratios may differ from the true ratio. A difference of zero indicates that the method yields the exact compression ratio of the full file. In FIG. 9A, the corrected chunk ratio is in orange and the original chunk ratio is in blue (see Appendix).

Figure 9B:
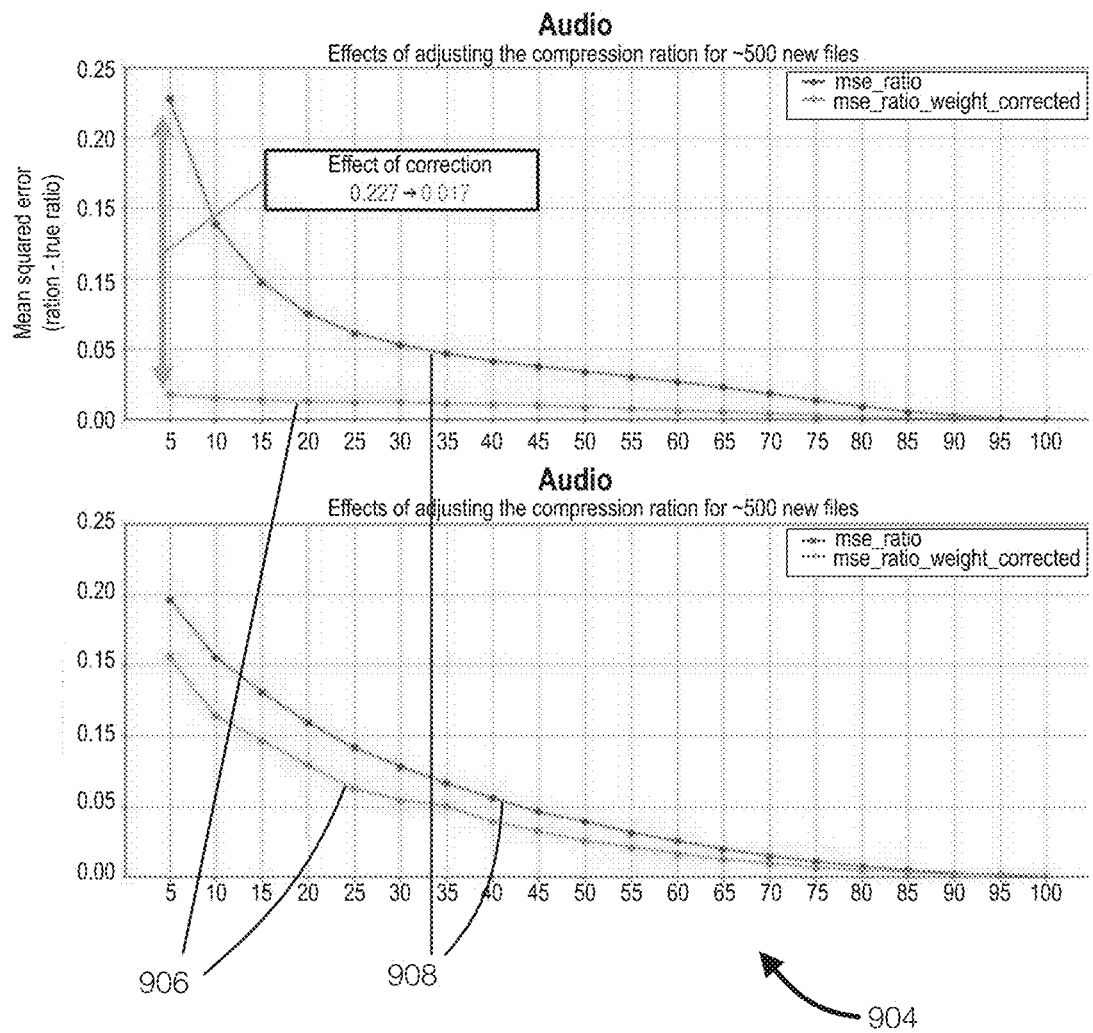
FIG. 9B discloses aspects mean squared errors of chunk ratios and corrected ratios.

FIG. 9B illustrates additional evidence to that provided in FIG. 9A. FIG. 9B illustrates a comparison 904 of how the compression ratios obtained for the chunk and the corrected compression ratios obtained with embodiments of the invention compare with the true compression ratios. In FIG. 9A, the mean squared errors between chunk ratios (corrected chunk ratios 906; original chunk ratios 908) and the true compression ratios. The means squared error obtained with embodiments of the invention is smaller than that obtained with the compression chunks without correction. In addition, the effectiveness of applying the correction factors should be particularly noticeable on smaller chunks. As shown in FIG. 9B, the positive effects of the correction factors (i.e., the reduction in the mean squared error) is noticeable across all chunk sizes, and even more noticeable across the smaller chunks. In FIG. 9B, the mean squared errors of the chunk ratios are in blue and corrected chunk ratios are in orange.

Figure 9C:
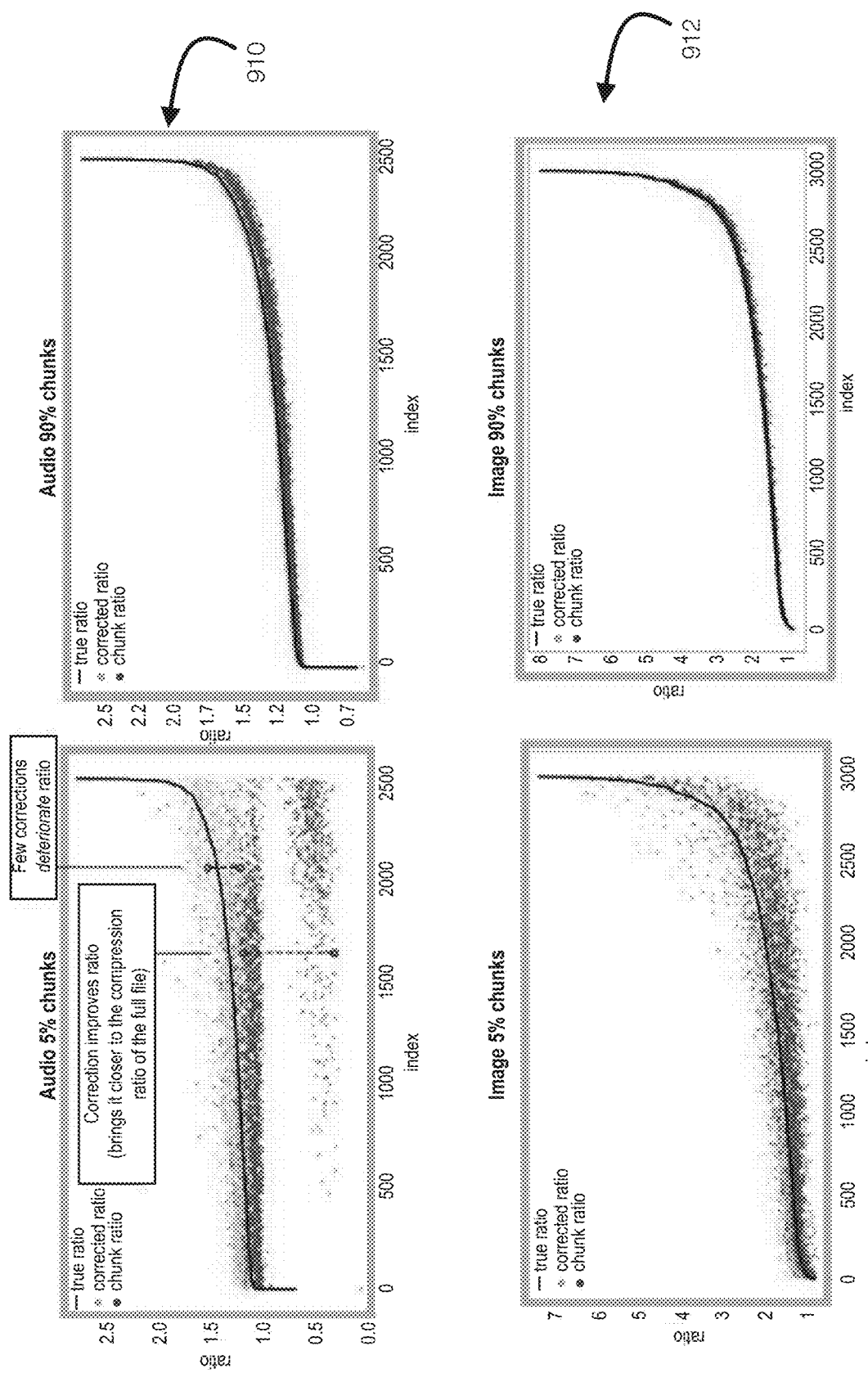
FIG. 9C discloses aspects of corrected ratios, chunk ratios, and true ratios.

FIG. 9C illustrates scatter plots to illustrate improvements in embodiments of the invention. The differences between the performance of the method on audio files (910) and image files (912), and on small (5%) and large chunks (80%) are highlighted in FIG. 9C. The solid line in FIG. 9C represent the true compression ratio to approximate on the test set, and the dots represent the approximations obtained with embodiments of the invention (orange) and by simply compressing the chunk, without correction (blue). The corrections are closer to the true compression ratio than the uncorrected compression metrics.

Overall, the compression ratios obtained with embodiments of the invention (orange cloud of points) are closer to the solid line on both small and large chunks. As shown in the figure for 5% chunks, there were a few cases in which the correction factor deteriorated the result initially obtained via the compression of the chunk. In most cases, however, the positive effect of applying the correction factor was is significant. Despite the less noticeable differences on 90% chunks, the orange cloud of points is also closer to the solid than the blue on.

The scatter plot 910 illustrates corrected ratios (in orange) and chunk ratios (in blue) versus the true ratio (in black) for 5% audio chunks and 90% chunks of audio files. An example of a correction improving the estimation and of a (rare) correction deteriorating the ratio are highlighted.

FIG. 9C also illustrates a scatter plot 912 to show the results for image files. Although the correction factor seems to significantly reduce the error for image files as well, the effects are not as pronounced as the ones for audio files. This is in line with the observation that the compression ratios obtained for the smaller chunks of image files are typically similar to the compression ratios obtained for the full files. That is, there is less space for improvement for certain types of files. In FIG. 9C, the orange dots correspond to corrected ratios and the blue dots to chunk ratios. The true ratios are in black in FIG. 9C.

These results show that embodiments of the invention obtain an estimated file compression metric that is much closer estimate to the true compression ratio than taking the chunk ratio without correction. In particular, embodiments of the invention allow for a close estimate (e.g., within 0.05 mean squared error) to be obtained with much smaller chunks. For audio files, this level of error is obtained with chunks larger than 35% when considering the chunk ratio, and with chunks as small as 5% when considering the corrected ratio output by the methods disclosed herein. For image files, this level of error is achieved by chunks larger than 45% considering the chunk ratio, and with chunks of 30% according to embodiments of the invention.

However, embodiments of the invention, in addition to predicting compression ratios of full files, are directed to selecting the best compressor for a given input file. In one example, an additional assessment is performed that does not necessarily relate to the error in the estimated compression metrics. This relates to ranking the compressors and determining how estimating the compression ratio improves the rankings of the available compressors.

Figure 9D:
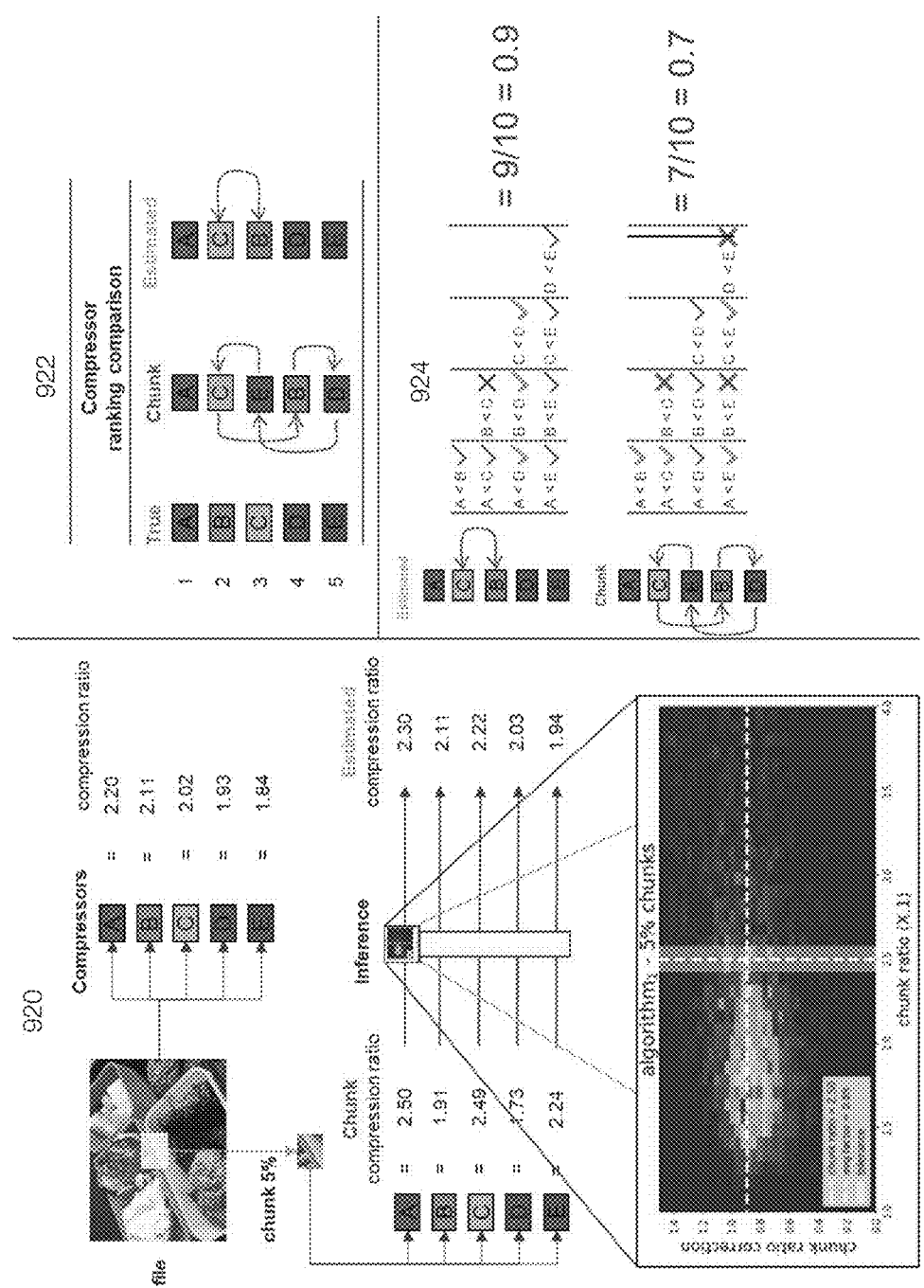
FIG. 9D discloses aspects of compressor rankings comparing true ratios with corrected ratios.

FIG. 9D illustrates and example of inferring to select compressor for a 5% chunk size of an image file. FIG. 9D also illustrates the resulting rankings and the scoring of the rankings with respect to the true rankings, which true rankings are based on true compression metrics. This illustrates that the chunk ratio and the estimated or corrected ratio obtained by embodiments of the invention may imply alternative compressor rankings. These may differ from the true ranking (ranking the compressors by the true ratio, given by compressing the whole original file).

To evaluate the effects of the correction factor in selecting the best compressor, a score of the resulting rankings is determined. The score is computed as a fraction of the partial orderings in the true ranking that are respected by the estimated ranking. In the example of FIG. 9D, the estimated ranking only changes one such order (B<C, meaning that, in the true ranking compressor B was placed higher than compressor C) out of the 10 orders. All other 9 orders are respected. The ranking based on chunk compression ratios, on the other hand, changes 3 orders (B<C, B<E and D<E) and thus only respects 7 out of the 10 orders.

For example, section 220 illustrates that 5 compressors A, B, C, D, and E were used to compress a file. Section 920 illustrates the true compression ratio, the chunk (5% chunk) compression ratio and the inference to generate the estimated compression ratio. The section 922 illustrates a true ranking, a chunk ranking, and an estimated ranking as previously discussed. The section 924 further illustrates the scorings of the chunk and estimated file rankings with respect to the true rankings.

Figure 9E:
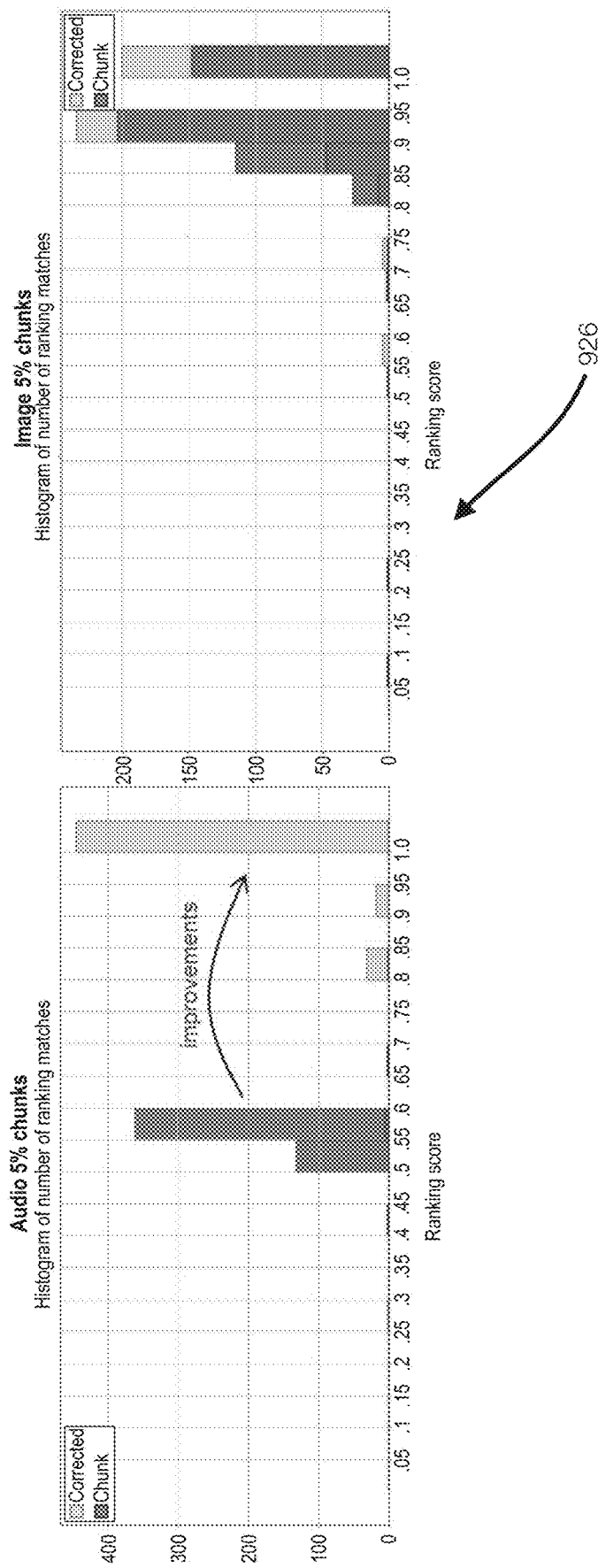
FIG. 9E discloses aspects of improvements in estimated compressor rankings.

Notice that one such ranking (and corresponding score) is computed for each of the 500 test files of each type. In FIG. 9E, we see the changes in the histogram of the score of the estimated rankings versus the chunk rankings over the entire test sets.

FIG. 9E illustrates histograms 926 of scores of the estimated rankings (corresponding to the estimated ratio) and the chunk rankings (corresponding to the chunk ratios) for the 5% chunks of the audio (left) and image (right) test sets. In FIG. 9E, the estimated ratio is in orange and the chunk rankings corresponding to the chunk ratios are in blue.

The results show that embodiments of the invention improve the results. For the audio test set, the scores of the chunk rankings are predominantly in the range between 0.5 and 0.6, while the estimated ranking—resulting from our method—achieves an identical ranking to the true ranking in over 400 out of the 500 cases. For the image set, a significant portion of the chunk rankings are already identical to the true ranking (around 150 cases), with an even larger portion with a score of in the range of 0.80 to 0.95. Still, the method performs positively, marginally improving some rankings (particularly the chunk rankings with lower scores in the 0.05-0.10 range, 0.20-0.25 range, 0.50-0.55 range and 0.65-0.70 range), but mostly by improving the rankings in the range of 0.80-0.90 range to the 0.90-1.00 range.

As previously suggested, embodiments of the invention may be used in various ways. For example, embodiments of the invention may be implemented in enterprises that apply federation and abstraction over multiple heterogeneous clouds (e.g., Amazon, Azure, private) and applying policy to dictate where operations are executed and data resides. Embodiments of the invention are useful for object storage (in the context of storing objects, transmitting objects, etc.). More specifically, embodiments of the invention are useful object storage in that, with awareness of the content and a history of how specific compressors will perform, the object storage system can make informed decisions on which compression to use to satisfy the desired policy for a given storage pool. For example, an administrator could specify:

I want to maximize the reduction in capacity consumed on Azure

I want to minimize the transfer time while writing to Dell ECS

I want to balance decompression time with transfer time while interacting with Amazon S3.

For a service that applies federation and abstraction over multiple heterogeneous clouds, the service can provide information about which compressor to use. This may be based on various metadata, such as object filename, content type, content length, bucket or destination, physical repository, and SLA parameters in the form of weights for compression ratio, compression throughput, and decompression throughput. This allows a user to employ controls according to their needs around capacity reduction, decompression time, or maximizing throughput.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

The following is a discussion of aspects of example operating environments for various embodiments of the invention. This discussion is not intended to limit the scope of the invention, or the applicability of the embodiments, in any way.

At least some embodiments of the invention provide for the implementation of the disclosed functionality in existing backup platforms, examples of which include the Dell-EMC NetWorker and Avamar platforms and associated backup software, and storage environments such as the Dell-EMC DataDomain storage environment. In general however, the scope of the invention is not limited to any particular data backup platform or data storage environment.

Devices in the operating environment may take the form of software, physical machines, or VMs, containers, or any combination of these, though no particular device implementation or configuration is required for any embodiment. Similarly, data protection system components such as databases, storage servers, storage volumes (LUNs), storage disks, replication services, backup servers, restore servers, backup clients, and restore clients, for example, may likewise take the form of software, physical machines or virtual machines (VM), though no particular component implementation is required for any embodiment. Where VMs are employed, a hypervisor or other virtual machine monitor (VMM) may be employed to create and control the VMs. The term VM embraces, but is not limited to, any virtualization, emulation, or other representation, of one or more computing system elements, such as computing system hardware. A VM may be based on one or more computer architectures, and provides the functionality of a physical computer. A VM implementation may comprise, or at least involve the use of, hardware and/or software. An image of a VM may take the form of a .VMX file and one or more .VMDK files (VM hard disks) for example.

As used herein, the term 'data' is intended to be broad in scope. Thus, that term embraces, by way of example and not limitation, data segments such as may be produced by data stream segmentation processes, data chunks, data blocks, atomic data, emails, objects of any type, files of any type including media files, word processing files, spreadsheet files, and database files, as well as contacts, directories, sub-directories, volumes, and any group of one or more of the foregoing. File types are also examples of data.

Example embodiments of the invention are applicable to any system capable of storing and handling various types of objects, in analog, digital, or other form. Although terms such as document, file, segment, block, or object may be used by way of example, the principles of the disclosure are not limited to any particular form of representing and storing data or other information. Rather, such principles are equally applicable to any object capable of representing information.

As used herein, the term 'backup' is intended to be broad in scope. As such, example backups in connection with which embodiments of the invention may be employed include, but are not limited to, full backups, partial backups, clones, snapshots, and incremental or differential backups.

It is noted with respect to the example method of Figure(s) XX that any of the disclosed processes, operations, methods, and/or any portion of any of these, may be performed in response to, as a result of, and/or based upon, the performance of any preceding process(es), methods, and/or, operations. Correspondingly, performance of one or more processes, for example, may be a predicate or trigger to subsequent performance of one or more additional processes, operations, and/or methods. Thus, for example, the various processes that may make up a method may be linked together or otherwise associated with each other by way of relations such as the examples just noted.

Following are some further example embodiments of the invention. These are presented only by way of example and are not intended to limit the scope of the invention in any way.

Embodiment 1. A method, comprising: receiving a file at a compression engine configured to select a compressor to compress the file, extracting a chunk from the file, compressing the chunk with all valid compressors, determining compression metrics for each of the valid compressors, determining a correction factor for each of the valid compressors, determining estimated file metrics for each of the valid compressors based on the compression metrics and the correction factors, and selecting an optimal compressor from the valid compressors based on the file metrics.

Embodiment 2. The method of embodiment 1, further comprising selecting a chunk size for the extracted chunk.

Embodiment 3. The method of embodiment 1 and/or 2, further comprising generating training data from a set of training files, the training data including a joint distribution of correction factors.

Embodiment 4. The method of embodiment 1, 2, and/or 3, further comprising locating the compression metrics onto the joint distribution of correction factors.

Embodiment 5. The method of embodiment 1, 2, 3, and/or 4, further comprising locating a neighborhood around the compression metrics for the chunk.

Embodiment 6. The method of embodiment 1, 2, 3, 4, and/or 5, further comprising computing an expected value of the correction factor within the neighborhood.

Embodiment 7. The method of embodiment 1, 2, 3, 4, 5, and/or 6, further comprising applying the correction factor to the compression metrics to determine the estimated file metrics.

Embodiment 8. The method of embodiment 1, 2, 3, 4, 5, 6, and/or 7, wherein selecting an optimal compressor includes selecting the optimal compressor based on the estimated file metrics, a service level agreement, and/or an application.

Embodiment 9. The method of embodiment 1, 2, 3, 4, 5, 6, 7, and/or 8, further comprising determining a type of the file and extracting the chunk with a corresponding module for the type of the file.

Embodiment 10. The method of embodiment 1, 2, 3, 4, 5, 6, 7, 8, and/or 9, wherein the chunk complies with a format of the file.

Embodiment 11. A method for performing any of the operations, methods, or processes, or any portion of any of these, or any combination thereof disclosed herein including combinations of embodiments 1-10.

Embodiment 12. A non-transitory storage medium having stored therein instructions that are executable by one or more hardware processors to perform operations comprising the operations of any one or more of embodiments 1 through 11.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Any one or more of the entities disclosed, or implied, by the Figures or elsewhere herein, may take the form of, or include, or be implemented on, or hosted by, a physical computing device. As well, where any of the aforementioned elements comprise or consist of a virtual machine (VM), that VM may constitute a virtualization of any combination of the physical components disclosed herein.

In one example, a physical computing device includes a memory which may include one, some, or all, of random access memory (RAM), non-volatile memory (NVM) such as NVRAM for example, read-only memory (ROM), and persistent memory, one or more hardware processors, non-transitory storage media, UI device, and data storage. One or more of the memory components of the physical computing device may take the form of solid-state device (SSD) storage. As well, one or more applications may be provided that comprise instructions executable by one or more hardware processors to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
    receiving a file at a compression engine configured to select a compressor from among available compressors to compress the file;
    extracting a chunk from the file;
    compressing the chunk with compressors that are valid for a file type of the file;
    determining compression metrics for each of the valid compressors;
    determining a correction factor for each of the valid compressors;
    determining estimated file metrics for each of the valid compressors based on the compression metrics and the correction factors; and
    selecting an optimal compressor from the valid compressors based on the file metrics.

2. The method of claim 1, further comprising selecting a chunk size for the extracted chunk.

3. The method of claim 1, further comprising generating training data from a set of training files, the training data including a joint distribution of correction factors.

4. The method of claim 3, further comprising locating the compression metrics onto the joint distribution of correction factors.

5. The method of claim 4, further comprising locating a neighborhood around the compression metrics for the chunk.

6. The method of claim 5, further comprising computing an expected value of the correction factor within the neighborhood.

7. The method of claim 6, further comprising applying the correction factor to the compression metrics to determine the estimated file metrics.

8. The method of claim 1, wherein selecting an optimal compressor includes selecting the optimal compressor based on the estimated file metrics, a service level agreement, and/or an application.

9. The method of claim 1, further comprising determining a type of the file and extracting the chunk with a corresponding module for the type of the file.

10. The method of claim 1, wherein the chunk complies with a format of the file.

11. A non-transitory storage medium having stored therein instructions that are executable by one or more hardware processors to perform operations comprising:
    receiving a file at a compression engine configured to select a compressor from among available compressors to compress the file;
    extracting a chunk from the file;
    compressing the chunk with all compressors that are valid for a file type of the file;
    determining compression metrics for each of the valid compressors;
    determining a correction factor for each of the valid compressors;
    determining estimated file metrics for each of the valid compressors based on the compression metrics and the correction factors; and
    selecting an optimal compressor from the valid compressors based on the file metrics.

12. The non-transitory storage medium of claim 11, further comprising selecting a chunk size for the extracted chunk.

13. The non-transitory storage medium of claim 11, further comprising generating training data from a set of training files, the training data including a joint distribution of correction factors.

14. The non-transitory storage medium of claim 13, further comprising locating the compression metrics onto the joint distribution of correction factors.

15. The non-transitory storage medium of claim 14, further comprising locating a neighborhood around the compression metrics for the chunk.

16. The non-transitory storage medium of claim 15, further comprising computing an expected value of the correction factor within the neighborhood.

17. The non-transitory storage medium of claim 16, further comprising applying the correction factor to the compression metrics to determine the estimated file metrics.

18. The non-transitory storage medium of claim 11, wherein selecting an optimal compressor includes selecting the optimal compressor based on the estimated file metrics, a service level agreement, and/or an application.

19. The non-transitory storage medium of claim 11, further comprising determining a type of the file and extracting the chunk with a corresponding module for the type of the file.

20. The non-transitory storage medium of claim 11, wherein the chunk complies with a format of the file.

* * * * *